(12) United States Patent
Reardon et al.

(10) Patent No.: US 7,094,291 B2
(45) Date of Patent: *Aug. 22, 2006

(54) SEMICONDUCTOR PROCESSING APPARATUS

(75) Inventors: Timothy J. Reardon, Walla Walla, WA (US); Craig P. Meuchel, Kalispell, MT (US); Thomas H. Oberlitner, Kalispell, MT (US); Aleksander Owczarz, San Jose, CA (US); Raymon F. Thompson, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 680 days.

This patent is subject to a terminal disclaimer.

(21) Appl. No.: 09/893,316

(22) Filed: Jun. 26, 2001

(65) Prior Publication Data

US 2002/0040679 A1 Apr. 11, 2002

Related U.S. Application Data

(60) Continuation of application No. 09/575,965, filed on May 23, 2000, now Pat. No. 6,375,741, which is a continuation of application No. 08/883,393, filed on Jun. 26, 1997, now Pat. No. 6,066,575, which is a division of application No. 08/422,485, filed on Apr. 12, 1995, now Pat. No. 5,658,387, which is a continuation-in-part of application No. 07/855,767, filed on Mar. 18, 1992, now Pat. No. 5,431,421, which is a continuation-in-part of application No. 07/665,942, filed on Mar. 6, 1991, now Pat. No. 5,235,995, which is a continuation-in-part of application No. 07/526,243, filed on May 18, 1990, now Pat. No. 5,168,887.

(51) Int. Cl.
*B05C 11/00* (2006.01)
*B05B 12/00* (2006.01)
*B05B 15/00* (2006.01)

(52) U.S. Cl. .................. 118/313; 118/300; 118/315
(58) Field of Classification Search ............. 118/313, 118/300, 315, 52, 302, 323, 21, 683, 667, 118/320; 427/240, 421, 423, 425, 72, 96, 427/372.2; 438/760, 758, 762; 134/33, 134/149, 153, 157, 902, 182, 200, 183
See application file for complete search history.

(56) References Cited

U.S. PATENT DOCUMENTS 3,641,973 A 2/1972 Shrader (Continued)

FOREIGN PATENT DOCUMENTS

EP 0184279 6/1986

(Continued)

OTHER PUBLICATIONS

Patton, Evan E., "Automated Gold Plate-Up Bath Scope Document and Machine Specifications," Tektronix, Aug. 4, 1989; pp. 1-13.

(Continued)

*Primary Examiner*—George Koch
(74) *Attorney, Agent, or Firm*—Perkins Coie LLP

(57) ABSTRACT

A semiconductor processor for spray coating wafers or other semiconductor articles. The processor has a compartment in which are mounted a wafer transfer, coating station and thermal treatment station. The coating station has a spray processing vessel in which a movable spray-head and rotatable wafer holder. The spray station has coating viscosity control features. An ultrasonic resonating spray-head is precisely supplied with coating from a metering pump. The heat treatment station heat cures the coating and then cools the wafer. The system allows coatings to be applied in relatively uniform conformational layers upon irregular surfaces.

54 Claims, 10 Drawing Sheets

U.S. PATENT DOCUMENTS

| | | |
|---|---|---|
| 3,770,598 A | 11/1973 | Creutz |
| 3,798,056 A | 3/1974 | Okinaka et al. |
| 3,950,184 A | 4/1976 | Adams et al. |
| 3,962,047 A | 6/1976 | Wagner |
| 3,978,578 A | 9/1976 | Murphy |
| 4,027,686 A | 6/1977 | Shortes et al. |
| 4,078,935 A * | 3/1978 | Nakagiri et al. ............ 430/527 |
| 4,092,176 A | 5/1978 | Kozai et al. |
| 4,110,176 A | 8/1978 | Creutz et al. |
| 4,113,492 A | 9/1978 | Sato et al. |
| 4,118,303 A | 10/1978 | Gibbs |
| 4,137,867 A | 2/1979 | Aigo |
| 4,170,959 A | 10/1979 | Aigo |
| 4,226,208 A | 10/1980 | Nishida et al. |
| 4,246,088 A | 1/1981 | Murphy et al. |
| 4,259,166 A | 3/1981 | Whitehurst |
| 4,280,882 A | 7/1981 | Hovey |
| 4,304,641 A | 12/1981 | Grandia et al. |
| 4,315,059 A | 2/1982 | Raistrick et al. |
| 4,336,114 A | 6/1982 | Mayer et al. |
| 4,339,297 A | 7/1982 | Aigo |
| 4,339,313 A | 7/1982 | Rechlicz |
| 4,339,319 A | 7/1982 | Aigo |
| 4,341,613 A | 7/1982 | Prusak et al. |
| 4,351,266 A | 9/1982 | Ando et al. |
| 4,373,988 A | 2/1983 | Bauser et al. |
| 4,376,685 A | 3/1983 | Watson |
| 4,405,416 A | 9/1983 | Raistrick et al. |
| 4,428,815 A | 1/1984 | Powell et al. |
| 4,435,266 A | 3/1984 | Johnston |
| 4,466,864 A | 8/1984 | Bacon et al. |
| 4,469,566 A | 9/1984 | Wray |
| 4,489,740 A | 12/1984 | Rattan et al. |
| 4,510,176 A | 4/1985 | Cuthbert et al. |
| 4,514,266 A | 4/1985 | Cole et al. |
| 4,518,678 A | 5/1985 | Allen |
| 4,534,832 A | 8/1985 | Doiron, Jr. |
| 4,565,607 A | 1/1986 | Hanak et al. |
| 4,590,094 A * | 5/1986 | Ringer, Jr. .................. 438/780 |
| 4,597,836 A | 7/1986 | Schaer et al. |
| 4,624,749 A | 11/1986 | Black et al. |
| 4,651,440 A * | 3/1987 | Karl .............................. 34/58 |
| 4,675,096 A | 6/1987 | Tateishi et al. |
| 4,693,805 A | 9/1987 | Quazi |
| 4,696,729 A | 9/1987 | Santini |
| 4,732,785 A | 3/1988 | Brewer |
| 4,750,505 A | 6/1988 | Inuta et al. |
| 4,788,994 A | 12/1988 | Shinbara |
| 4,827,867 A | 5/1989 | Takei et al. |
| 4,828,654 A | 5/1989 | Reed |
| 4,838,978 A | 6/1989 | Sekine et al. |
| 4,838,979 A | 6/1989 | Nishida et al. |
| 4,856,456 A | 8/1989 | Hillman et al. |
| 4,856,641 A | 8/1989 | Matsumura et al. |
| 4,861,452 A | 8/1989 | Stierman et al. |
| 4,861,563 A | 8/1989 | Shekerjian et al. |
| 4,879,007 A | 11/1989 | Wong |
| 4,906,346 A | 3/1990 | Hadersbeck et al. |
| 4,924,890 A | 5/1990 | Giles et al. |
| 4,931,149 A | 6/1990 | Stierman et al. |
| 5,000,827 A | 3/1991 | Schuster et al. |
| 5,024,746 A | 6/1991 | Stierman et al. |
| 5,039,381 A | 8/1991 | Mullarkey |
| 5,055,425 A | 10/1991 | Leibovitz et al. |
| 5,069,760 A | 12/1991 | Tsukamoto et al. |
| 5,078,852 A | 1/1992 | Yee et al. |
| 5,085,560 A | 2/1992 | Thompson et al. |
| 5,092,975 A | 3/1992 | Yamamura et al. |
| 5,096,550 A | 3/1992 | Mayer et al. |
| 5,100,502 A | 3/1992 | Murdoch et al. |
| 5,100,516 A | 3/1992 | Nishimura et al. |
| 5,155,336 A | 10/1992 | Gronet et al. |
| 5,156,174 A * | 10/1992 | Thompson et al. ......... 134/153 |
| 5,158,100 A | 10/1992 | Tanaka et al. |
| 5,162,260 A | 11/1992 | Leibovitz et al. |
| 5,168,887 A | 12/1992 | Thompson et al. |
| 5,169,408 A | 12/1992 | Biggerstaff et al. |
| 5,222,310 A | 6/1993 | Thompson et al. |
| 5,224,504 A | 7/1993 | Thompson et al. |
| 5,227,041 A | 7/1993 | Brogden et al. |
| 5,228,966 A | 7/1993 | Murata |
| 5,230,743 A | 7/1993 | Thompson et al. |
| 5,232,328 A | 8/1993 | Owczarz et al. |
| 5,235,995 A * | 8/1993 | Bergman et al. ............ 134/105 |
| 5,238,500 A | 8/1993 | Bergman |
| 5,252,137 A | 10/1993 | Tateyama et al. |
| 5,252,807 A | 10/1993 | Chizinsky |
| 5,256,274 A | 10/1993 | Poris |
| 5,259,407 A | 11/1993 | Tuchida et al. |
| 5,270,248 A | 12/1993 | Rosenblum et al. |
| 5,275,976 A | 1/1994 | Moslehi |
| 5,290,361 A | 3/1994 | Hayashida et al. |
| 5,294,257 A | 3/1994 | Kelly et al. |
| 5,312,487 A | 5/1994 | Akimoto et al. |
| 5,316,974 A | 5/1994 | Crank |
| 5,328,589 A | 7/1994 | Martin |
| 5,332,487 A | 7/1994 | Young, Jr. et al. |
| 5,340,437 A | 8/1994 | Erk et al. |
| 5,349,978 A | 9/1994 | Sago et al. |
| 5,368,711 A | 11/1994 | Poris |
| 5,372,699 A | 12/1994 | Rischke et al. |
| 5,377,708 A | 1/1995 | Bergman et al. |
| 5,391,285 A | 2/1995 | Lytle et al. |
| 5,405,518 A | 4/1995 | Hsieh et al. |
| 5,415,890 A | 5/1995 | Kloiber et al. |
| 5,421,987 A | 6/1995 | Tzanavaras et al. |
| 5,429,733 A | 7/1995 | Ishida |
| 5,431,421 A * | 7/1995 | Thompson et al. ......... 279/139 |
| 5,658,387 A * | 8/1997 | Reardon et al. ............ 118/323 |
| 6,375,741 B1 * | 4/2002 | Reardon et al. ............ 118/313 |

FOREIGN PATENT DOCUMENTS

| | | |
|---|---|---|
| EP | 0290218 | 11/1988 |
| EP | 0360678 | 3/1990 |
| JP | 55-069817 | 5/1980 |
| JP | 55-174652 | 3/1983 |
| JP | 58-182823 | 10/1983 |
| JP | 59-208067 | 11/1984 |
| JP | 61-139314 | 12/1987 |
| JP | 63-118093 | 5/1988 |
| JP | 63-153839 | 6/1988 |
| JP | 62-36974 | 9/1988 |
| JP | 62-66262 | 9/1988 |
| JP | 62-194881 | 2/1989 |
| JP | 01-129156 | 5/1989 |
| JP | 62-278528 | 5/1989 |
| JP | 63-165764 | 1/1990 |
| JP | 04131395 | 5/1992 |
| JP | 04280993 | 10/1992 |
| JP | 6017291 | 1/1994 |
| WO | WO 97/12079 | 4/1997 |

OTHER PUBLICATIONS

Evan E. Patton, et al., "Automated Gold Plate-Up Bath Scope Document and Machine Specifications", Tektronix Confidential, dated Aug. 4, 1989, pp. 1-13.

Tektronix Invention Disclosure Form (Company Confidential), not dated, 4 pages.

* cited by examiner

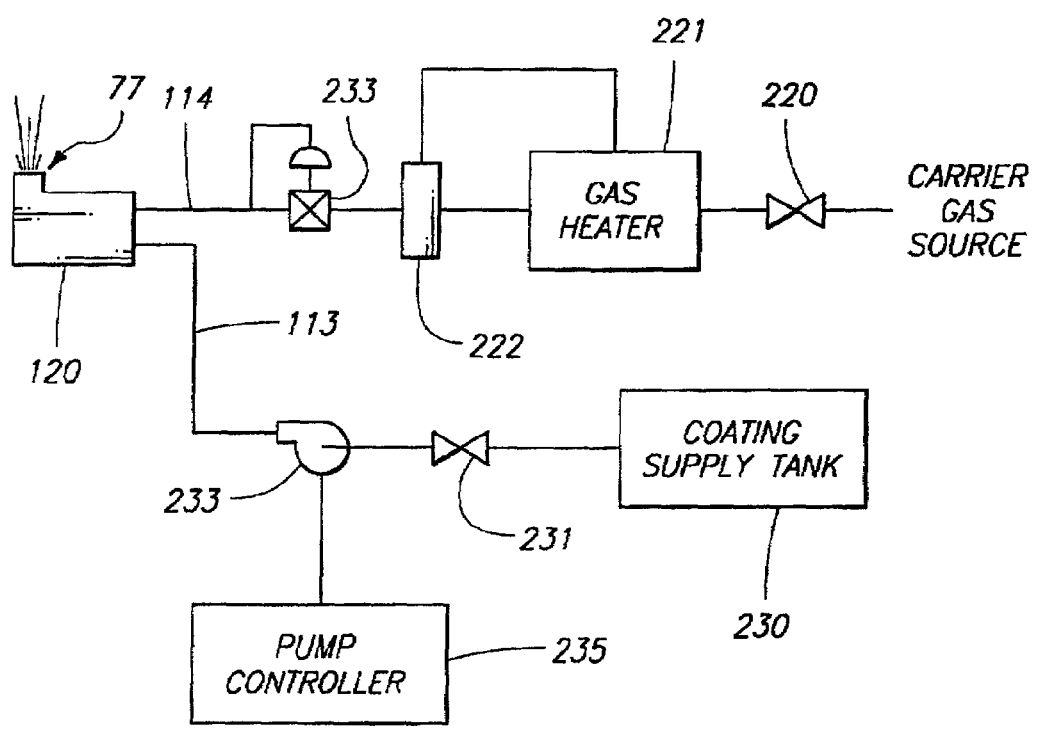

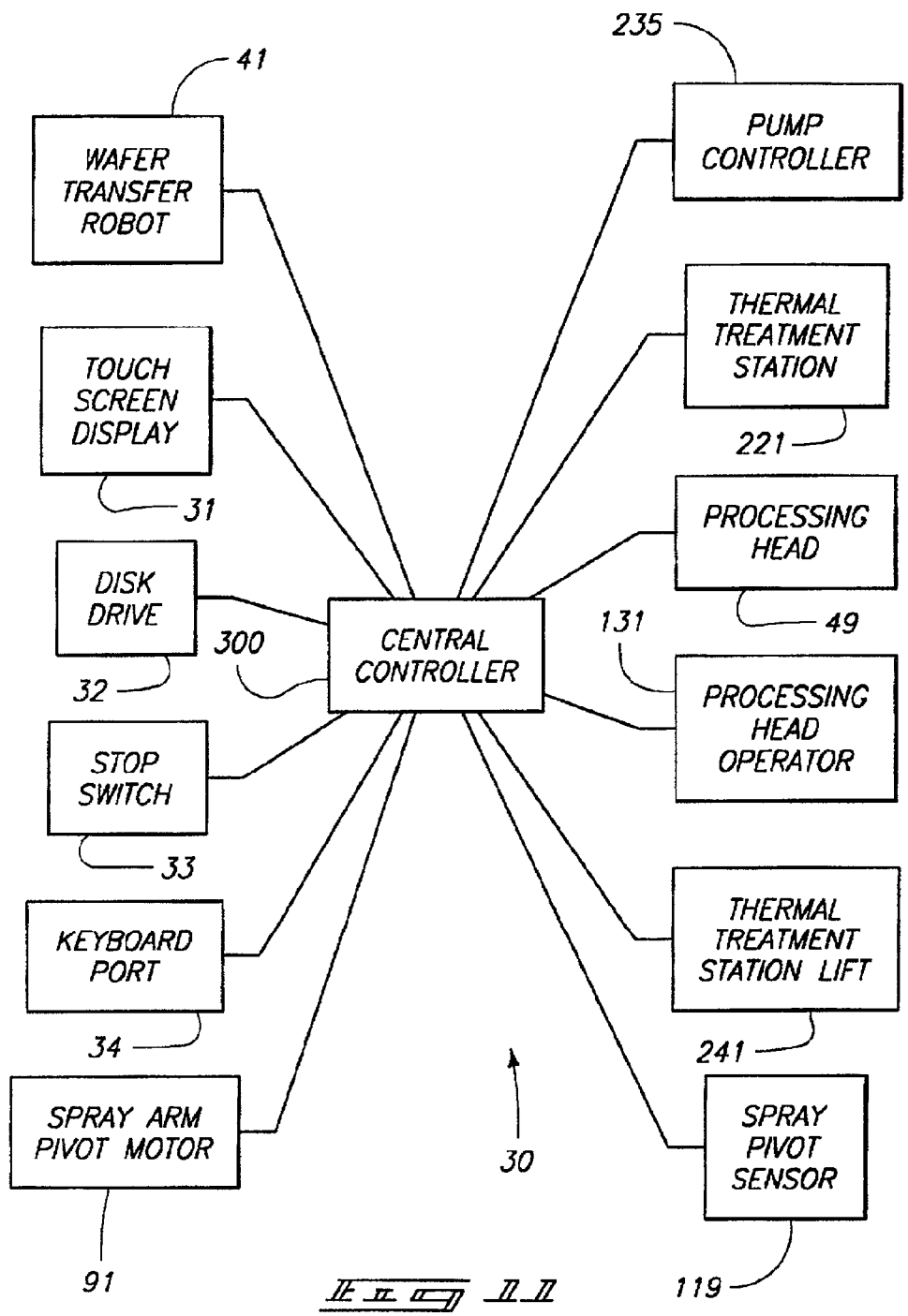

SEMICONDUCTOR PROCESSING APPARATUS

CROSS-REFERENCE TO RELATED APPLICATIONS

This application is a continuation of U.S. patent application Ser. No. 09/575,965 filed May 23, 2000; now U.S. Pat. No. 6,375,741 which is a continuation of U.S. patent application Ser. No. 08/883,393 filed Jun. 26, 1997 (now U.S. Pat. No. 6,066,575); which is a division of U.S. patent application Ser. No. 08/422,485 filed Apr. 12, 1995 (now U.S. Pat. No. 5,658,387); which is a continuation-in-part of U.S. patent application Ser. No. 07/855,767 filed Mar. 18, 1992 (now U.S. Pat. No. 5,431,421); which is a continuation-in-part of U.S. patent application Ser. No. 07/665,942 filed Mar. 6, 1991 (now U.S. Pat. No. 5,235,995); which is a continuation-in-part of U.S. patent application Ser. No. 07/526,243 filed May 18, 1990 (now U.S. Pat. 5,168,887).

Priority under 35 U.S.C. §120 is claimed based upon the above applications and U.S. patent application Ser. Nos. 07/855,767 and 07/665,942 are also hereby incorporated by reference.

TECHNICAL FIELD

This invention relates to apparatus and methods for coating semiconductor wafers, flat panel displays, data disks, microelectronic components, thin film heads for hard disk drives, and other microelectronic or semiconductor articles that must be coated with a relatively uniform confirmation coating layer over irregular surfaces.

BACKGROUND OF THE INVENTION

The production of semiconductor devices, such as semiconductor wafers, semiconductor substrates, flat panel displays, data discs and other similar articles, generally requires at least one step in which a coating must be applied in a uniform layer across a surface of the device. For instance, the production of integrated circuits frequently involves the application of a uniform coating of photoresist on a silicon wafer or substrate.

The small feature size and variety of micro-devices being produced need highly uniform coating layers to be produced. The production of micro-devices is significantly affected by current limitations associated with non-uniformity in coating layers, particularly when coating over irregular surfaces. Such irregular surfaces occur due to the micro-devices having one or more features such as vias, channels, and peaks. These features produce irregularities in the height of the surface over which the coating is being applied. These surface irregularities cause problems and limit the overall production performance and effectiveness of conventional coating apparatus and methods because the coatings cannot be applied in a sufficiently uniform manner. The coatings often fill channels, run off the peaks, and in some instances are unable to adequately fill vias. As a result, the coating layer is thickened in the channels, and thinned on the peaks. Vias can either be underfilled or overfilled depending upon viscosity and feature geometry.

A common prior art technique for applying photoresist coatings involves spraying the wafer with a photoresist and then spinning the wafer. The spinning action of the wafer produces centrifugal forces which spread the liquid photoresist. However, these spin application techniques have difficulties in providing layers having good uniformity. Striations are a common problem. These striations can be initiated by surface features, contaminants, or fluid properties of the coating being applied. These and other irregularities have derogatory effects on the production of microcircuits and other micro-devices.

Prior art semiconductor coating techniques have not been able to provide thin, uniform coating layers which conform to irregularities present on the wafer or other semiconductor surface being coated. Spin coating techniques produce coating layers which tend to have an approximately level or planar surface even though surface features of varying heights are contained beneath the coating. The surfaces of wafers can contain topographical height variations of 10–40 microns with associated horizontal increments of 100–500 microns. Coatings thicknesses can thus vary in the range of 5–30 microns. This creates variations in the width of lines or other critical dimensions. These variations can in turn cause significant process yield losses. Thus, there is a need for improved coating apparatus and methods which can produce a coating layer onto semiconductor surfaces which is conformational to provide more uniform coating thickness, even when applied over surfaces having features of varying heights and shapes.

Prior art coating techniques have also been troubled by difficulties which arise during lithographic processes performed upon coating layers. These difficulties arise when coating thicknesses vary to a degree sufficient to cause focusing variations in the lithographic beams used to define features of a device. These problems are in particular significant when complex topographical configurations are used. This increased difficulty occurs due to the greater difficulty in producing uniform coating thicknesses on complex topographical configurations.

Prior art semiconductor coating equipment and techniques have also been deficient in not providing uniform application of relatively viscous coating materials. The exact mechanism causing the difficulties are not fully understood. This problem of coating with viscous coatings is further exacerbated when the surface being coated is irregular, such as discussed above.

The application of coatings to semiconductor article surfaces is further complicated by the extraordinarily low levels of contamination which must be maintained when processing semiconductor materials. Contaminating particles will cause defects to exist in the resulting products and will typically decrease device yields and profitability. Thus there is a strong need to produce uniform coating layers free from contaminants or congealed particulate accumulations which may form from the coating materials themselves.

Another problem associated with present equipment and methods for coating semiconductor wafers and similar devices is that a relatively large volume of coating material is used. This occurs in some instances because the coating is applied and the wafer is spun to provide centrifugal dispersion of the coating across the wafer surface. This leads to coating material being spun off and wasted. In other equipment the coating spray is not efficiently applied and is wasted in part as an aerosol of coating particles which do not adhere to the surface being coated.

A further problem associated with current techniques is inefficient coating application equipment and techniques. The excess coating material is either wasted, or else time and money are expended to dispose of, reformulate, or recycle the spent coating material. Thus there is a continuing need for methods and apparatus which can more precisely coat such articles using a relatively smaller amount of coating material and with reduced waste.

For these and other reasons, there is a strong need for improved methods and apparatus which can provide a uniform coating layer on irregular semiconductor article surfaces using reduced amounts of the coating materials.

BRIEF DESCRIPTION OF THE DRAWINGS

Preferred embodiments of the invention are described below with reference to the accompanying drawings, which are briefly described below.

FIG. 10 is a schematic diagram showing fluid components associated with the spray coating station.

FIG. 11 is a schematic block diagram showing control system components.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

System Generally

Figure 1:
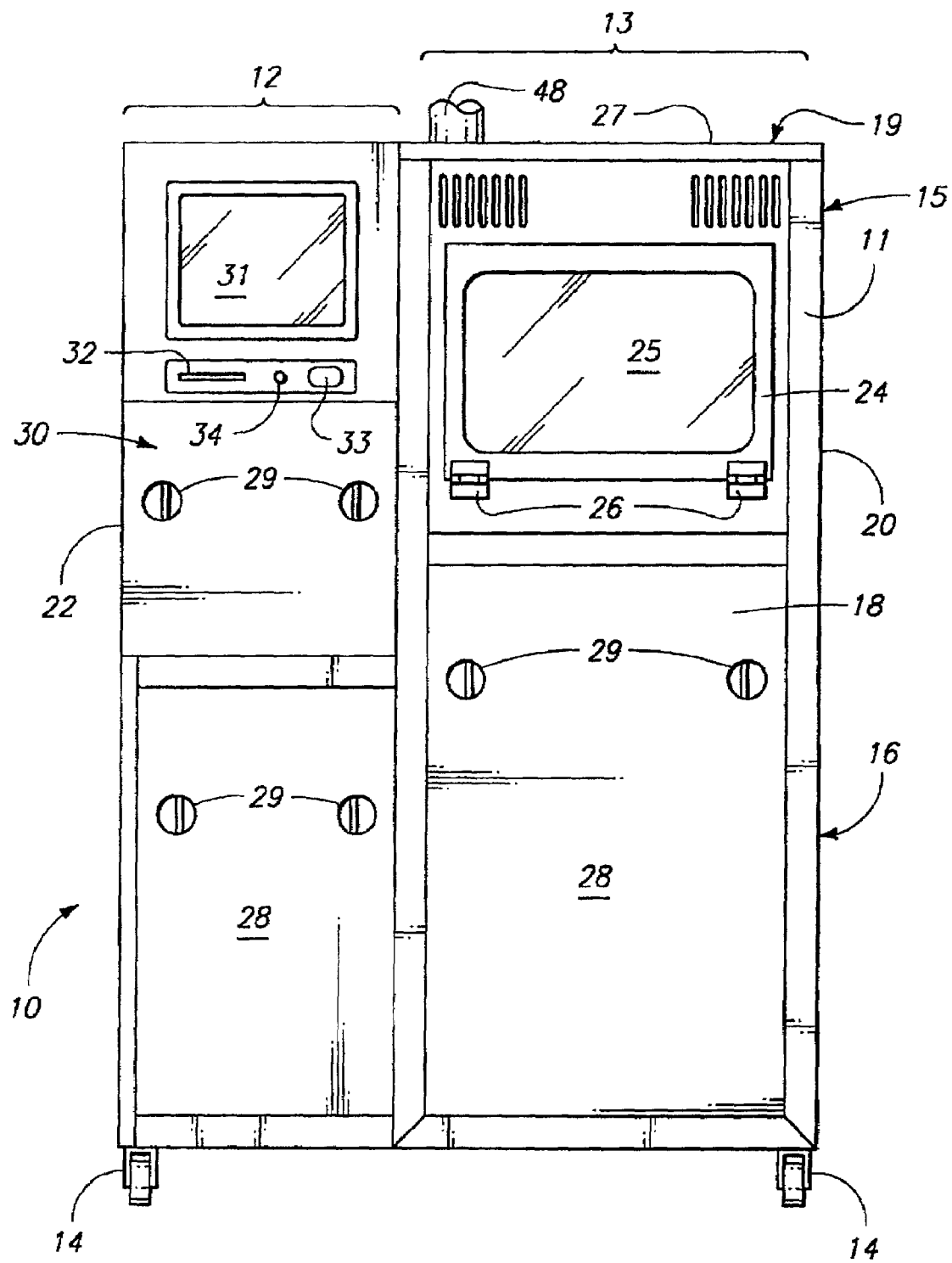
FIG. 1 is a front elevational view showing a preferred wafer spray coating and processing system made in accordance with the concepts of this invention.

FIG. 1 shows a preferred semiconductor spray coating processing system 10 built in accordance with the novel concepts of this invention. Processing system 10 includes a frame or framework 11 upon which other components are mounted. Framework 11 and remaining portions of the processor are advantageously supported on rollable casters 14.

Framework 11 is advantageously constructed so as to provide a control side or section 12 and a wafer processing side or section 13. The processing side has a processing compartment 15 which encloses a work space. Processing compartment 15 includes several system stations which receive and process semiconductor substrates, semiconductor wafers, flat panel displays, data disks, and other semiconductor products or articles requiring ultra-low contamination processing. The processing accomplished by processing system 10 includes spraying a desired coating upon the articles. Below the processing compartment 15 is an equipment storage compartment 16 wherein various components of the system and consumable supplies, such as liquid coating materials are stored.

Processor 10 includes a front 18 which has several removable access panels 28 which are detachable from frame 11 by opening catches 29. Similar panels are used on the sides 20 and 22, and back 21 of the processor. Processor 10 also includes a top 19. The top processing side has been removed in the view shown in FIG. 2. This top panel preferably has a window (not shown) for viewing into the processing compartment.

FIG. 1 shows that the processing side 13 further has an access door 24 which is pivotally connected to a front panel of the processing compartment using hinges 26. Door 24 preferably has a view window 25 for operator observation of the processes being performed within processing compartment 15 during operation.

FIG. 1 also shows frontal portions of the control side 12 of processor 10. Primary portions of a control subsystem 30 is mounted within control side 12. Illustrated components include a display 31 which is a touch screen cathode ray tube, known in the art. A data disk drive 32 is mounted below the display. A keyboard connection port 34 allows a keyboard to be connected for purposes of programming the controller. An emergency stop button 33 is mounted for easy access to allow the operator to stop operation of the machine for any reason. The control subsystem 30 includes a computer or other central controller 300 such as typically used in a variety of offices and industrial control situations. The control system computer 300 interfaces through connection wiring and in some cases related electronic subcircuits to both monitor system operation and provide operational control signals. FIG. 11 shows the relationships in a schematic diagram. The specific control scheme used can vary significantly according to well-known digital control options available to provide the operational capabilities described below in greater detail.

Figure 2:
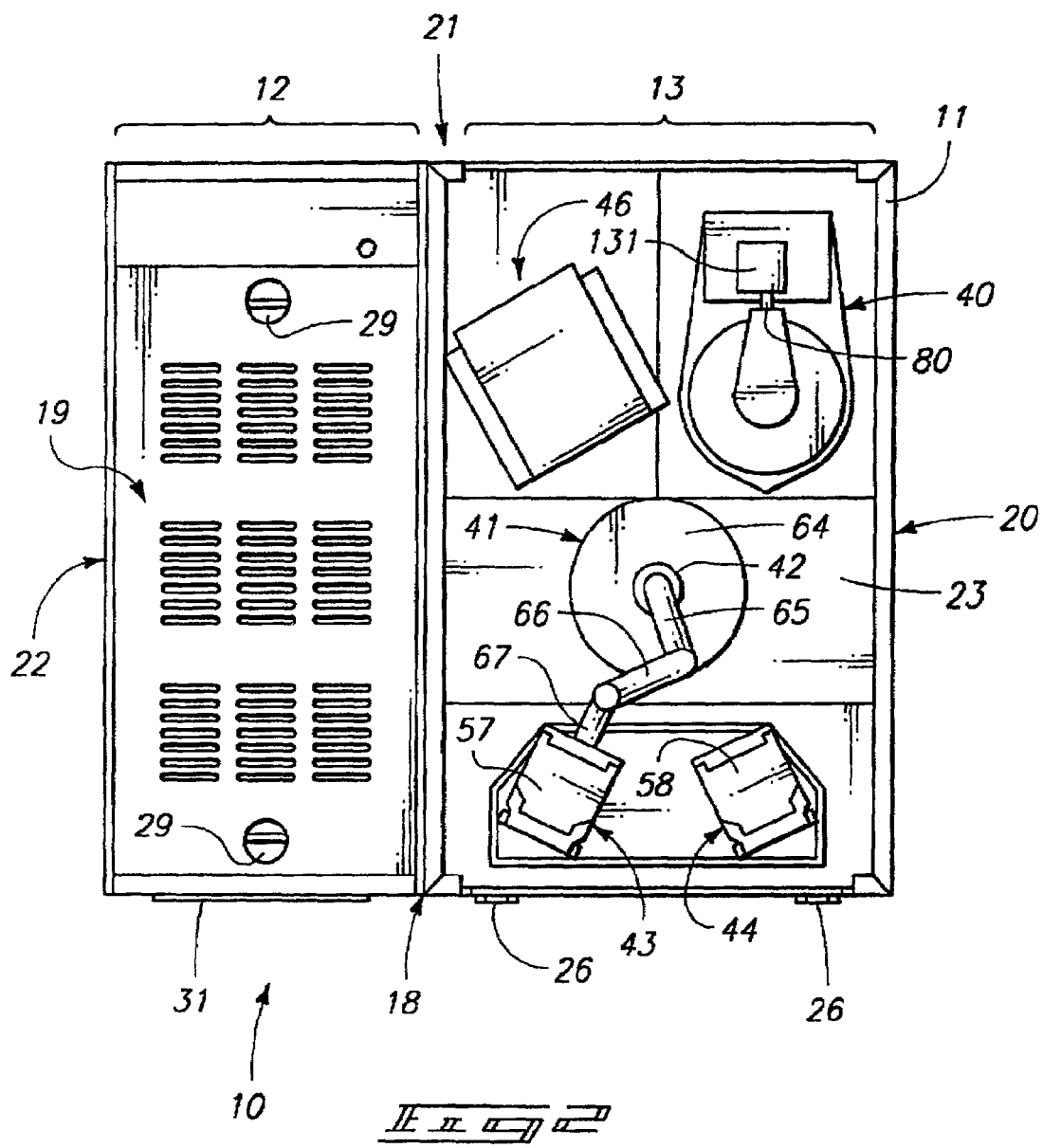
FIG. 2 is a top view showing the system of FIG. 1. Portions have been removed to better show features of the invention.

FIG. 2 shows the top of processor 10. The processing compartment 15 is shown with the top cover 27 removed for purposes of illustration. The processing compartment top cover 27 also includes an exhaust port 48 (FIG. 1) through which gases emanating from the processing compartment can be withdrawn, such as to a facilities exhaust line (not shown).

Wafer Transfer

FIG. 2 includes a processing compartment deck 23. Deck 23 is supported by the framework and in part supports various components which are mounted in or adjacent to the processing compartment. As shown, deck 23 mounts a robotic wafer transfer station 41. Wafer transfer station 41 has a base 64 which is mounted upon deck 23. The wafer transfer mechanism also includes a first arm 65 which is pivotally connected to base 64 at a proximate end of the first arm. Arm 65 is vertically adjustable relative to the base using an extension cylinder 42. A second arm 66 has a proximate end which is pivotally connected to the distal end of first arm 65. The distal end of second arm 66 carries a wafer engagement tool 67. The wafer engagement tool is preferably mounted to allow pivotal action of the engagement tool relative to the distal end of second arm 66. The wafer engagement tool is advantageously a vacuum assisted end effector which is inserted beneath a wafer and applies a vacuum to the wafer backside to hold the wafer in position upon the palm or upper face of the engagement tool. The application of vacuum to the wafer is controlled between applied and released conditions to facilitate holding and release of the wafer.

Wafer Input and Output Stations

Also mounted upon deck 23 are a wafer input station 43 and a wafer output station 44. Stations 43 and 44 inventory wafers being processed. Input station 43 holds an input wafer carrier 57 which contains a group of wafers which have been placed into the processing compartment for treatment. Output station 44 holds an output wafer carrier 58 which holds wafers which have been treated. FIG. 2 also shows a spray coating process station 40 and a thermal treatment station 46.

Introduction to Process

The processing of wafers through processor 10 can be generally understood from FIG. 2 which will now be described. Wafers are fed to the system by opening processing compartment access door 24 and inserting input wafer cassette 57 loaded with wafers to be processed. The loading is typically done by manual insertion. As shown, the wafer cassette is oriented with the wafers in horizontal position. Wafers are individually removed from the input station wafer cassette 57 by the robotic wafer transfer mechanism 41. The wafers are transferred to the spray coating station 40. In the spray coating station the wafers are spray coated according to the processes more fully explained below.

Wafer transfer 41 then removes the wafers from the spray coating station 40 and moves them to the thermal treatment station 46. In the thermal treatment station the wafers are most preferably heated to a desired heat treatment temperature and then cooled to a desired cold treatment temperature. In the preferred thermal treatment station 46, the heat treatment and cold treatment are carried out in distinct thermal treatment chambers. The wafer transfer mechanism 41 moves the individual wafers between the heating and cooling chambers within station 46.

After thermal treatment, the wafers are removed from thermal station 46 by wafer transfer 41. The spray coated and thermally treated wafers are then moved to the output wafer cassette 58. When the batch of wafers have been processed, the output cassette is removed via access door 24 and the processor 10 is ready to process another batch of wafers.

Spray Coating Station

Figure 3:
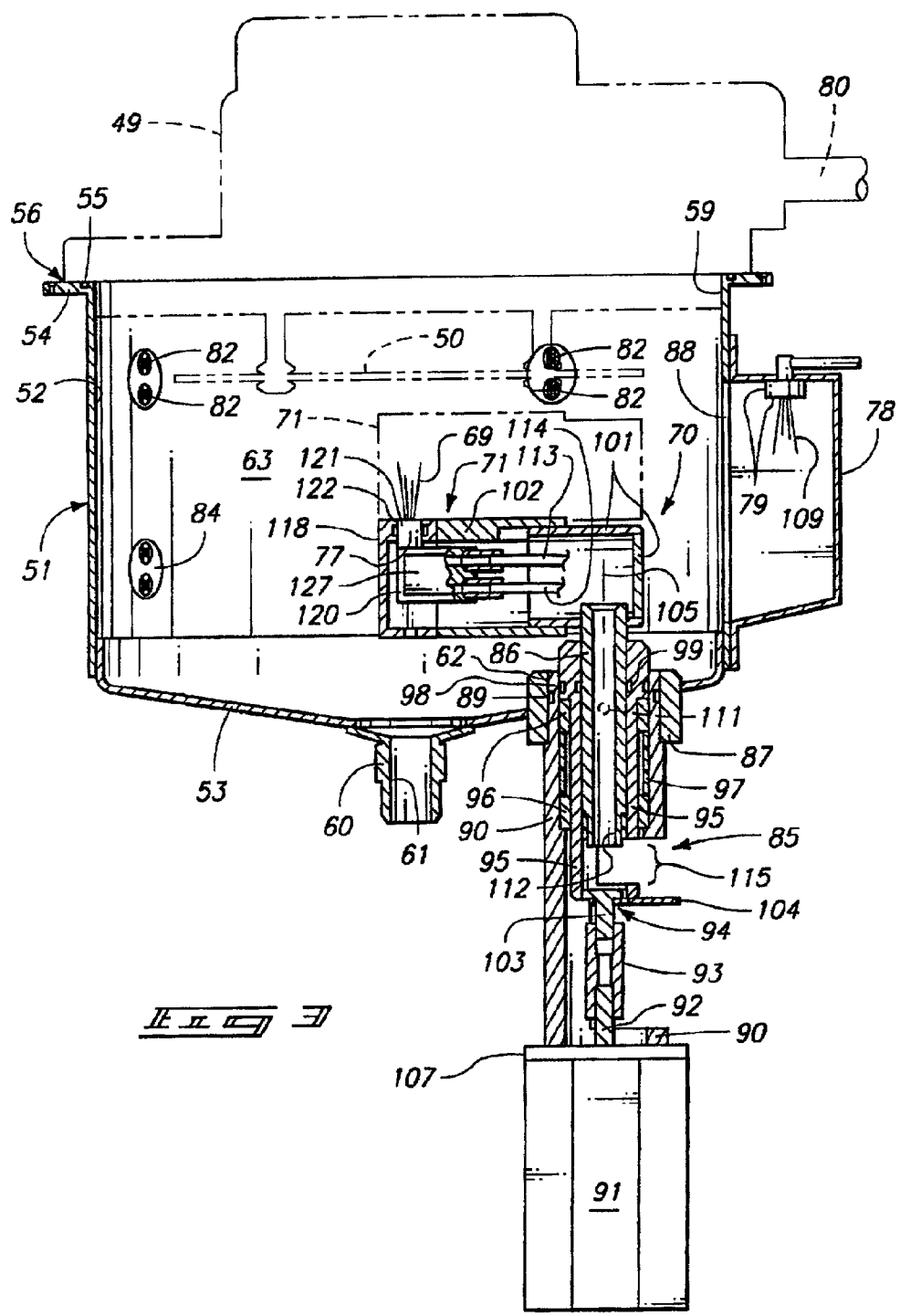
FIG. 3 is a side sectional view showing portions of a spray processing vessel bowl used in the system of FIG. 1. A spray processing vessel head is shown in phantom lines.

FIG. 3 shows portions of the spray coating station 40 in greater detail. The spray coating station includes a processing head assembly 49 which supports and rotates a wafer 50 being processed. The processing head is described in greater detail below, particularly in connection with FIG. 4. The processing head is constructed to mate with a spray processing vessel bowl 51 to form a spray coating spray processing vessel 56. In the closed arrangement shown in FIG. 3, the processing head and processing bowl define a substantially enclosed processing chamber 63.

Processing head 49 is movable upwardly from the closed position shown in FIG. 3 to allow access through a processing bowl top opening 59 through which wafer 50 and portions of the processing head are lowered. Processing head 49 is most preferably supported by a processing head shaft 80. Processing head shaft 80 is operated by a processing head operator 81 to both raise and lower the processing head. Processing head operator 81 is most preferably capable of both vertical motion and pivotal motion which causes shaft 80 to turn the processing head in a reciprocal manner between face-up and face-down positions. When the processing head is turned into a face-up position (not shown), the wafer 50 is positioned into the processing head with the wafer face-up. This is in comparison to the face-down position shown in FIG. 3. The back side of wafer 50 is adjacent to the processing head.

Spray Coating Station—Processing Vessel Bowl

FIG. 3 shows that the preferred processing vessel bowl portion 51 has a sidewall 52. Sidewall 52 is preferably cylindrical. As shown, the upper edge of the sidewall is provided with a top opening flange 54 which surrounds and defines top opening 59. Flange 54 is provided with a seal groove 55 which receives a suitable seal, such as an O-ring seal, therein for sealing between the processing head 49 and the processing vessel base or bowl 51.

Sidewall 52 is advantageously provided with a plurality of chamber cleaning nozzles 82 and 84. Nozzles 82 and 84 are preferably arranged in two levels, such as the upper level nozzles 82 and the lower level nozzles 84. The nozzles are positioned at suitable locations to allow solvent washing of the processing vessel interior surfaces. In the preferred construction there are two upper nozzles which are advantageously positioned at an angular spacing of 90°, at positions 0° and 90°. The two lower nozzles 84 are at 180° and 270° positions such that the nozzles are equiangularly spaced about the centerline. The position of nozzle 84 has been shifted in FIG. 3 for purposes of illustration. The chamber cleaning nozzles advantageously each have two nozzle openings to provide two jets which provide enhanced jet dispersion and greater spray washing effectiveness.

FIG. 3 also shows bowl 51 includes a frustoconical bottom bowl piece 53 which essentially defines the bottom wall of the processing vessel. The bottom wall also includes a drain having a drain fitting 60 and drain opening 61. The bottom wall of the spray processing vessel also includes a spray assembly opening 62. Spray assembly opening 62 receives portions of a spray assembly 70 therethrough. Spray assembly opening 62 is advantageously provided with a reinforcing boss 87 which defines the opening and is securely affixed to the bottom wall 53, such as by welding. Spray assembly 70 produces a coating spray jet 69 of coating material and carrier gas which is directed onto the downwardly oriented face of wafer 50.

FIG. 3 also shows a processing bowl side compartment 78 which extends partially along one exterior side of the processing bowl 51. Side compartment 78 serves as a storage and nozzle cleaning compartment adjacent to the processing chamber 63. Compartment 78 connects with processing chamber 63 via a storage compartment connection opening 88. A spray arm wash-down nozzle 79 is mounted near the top of the storage compartment. When a spraying operation or series of operations have been completed, the spray arm is pivoted into the storage compartment 78. The wash-down nozzle 79 is supplied with solvent to form a wash-down jet 109 which sprays solvent upon the spray-head 71 to, in particular, wash the coating spray nozzle 77. This prevents buildup of coating material at the nozzle 77 which may otherwise cause pluggage or adversely affect the coating application jet 69.

Spray Coating Station—Sprayer Assembly

FIG. 3 shows the sprayer assembly in sectional view to indicate the preferred construction. Sprayer 70 includes a spray-head 71 which is movable within the processing chamber 63 to effect motion of coating spray nozzle 77. In the preferred construction shown, the spray swings about a pivot axis 105. This in combination with rotational movement of the wafer 50 allows all areas of the downwardly facing surface of wafer 50 to be coated.

The elevational position of the spray head 71 is preferably adjustable. FIG. 3 shows spray-head 71 in the axially downward position. In this downward or removed position the spray-head is spaced relatively further from the wafer. A phantom line box illustrates spray-head 71 in an alternative upward or close position when it has been moved upwardly into closer proximity to the wafer 50. The elevational or proximity position of the spray head relative to the surface being coated is adjustable within a range of differing proximity positions lying between a closest position and a remotest position. This allows the operator to optimize coating performance according to the requirements associated with a particular coating being used and other associated coating application parameters. As shown, the adjustment is accomplished using a manual adjustment mechanism which is described below.

Spray-head 71 is mounted upon a spray-head shaft 86. Spray-head shaft 86 forms part of a spray head actuator 85. Spray-head actuator 85 includes an outer support tube 90 which mounted upon the reinforcing boss 87, such as by threadably receiving the tube within the boss. A seal 89 is advantageously included near the upper end to seal between the boss and support tube. A pivot motor 91 is mounted upon the lower end of support tube 90, preferably using a motor mounting flange 107 which is connected to the support tube, such as by welding. The pivot motor is fastened to flange 107 by fasteners (not shown).

Pivot motor 91 has an output shaft 92 which is connected by a coupling 93 to a pivot tube assembly 94. The pivot tube assembly also advantageously includes an angular position indicator arm 104 which is detected by a pivot position sensor 119 (FIG. 11) to indicate the pivot position for control of the pivot arm movement. Angular position indicator arm 104 is connected to a connection piece 103. Connection piece 103 is partially received in the upper end of the motor coupling 93. Connection piece 103 is preferably connected to the an outer pivot tube 95.

The pivot tube assembly includes outer pivot tube 95. Outer pivot tube 95 pivots within support tube 90. Outer pivot tube 95 is advantageously supported by bearings, such as the two bushing-type bearings 96. An annular spacer 97 extends between and spaces bushings 96. An outer seal 98 seals between pivot tube 95 and the inner diameter of support tube 90. An inner seal 99 seals between the spray-head support shaft 86 and the inner diameter of pivot tube 86.

Tubes 95 and shaft 86 pivot together in response to torque applied by the output shaft 92 of motor 91. The elevational position of shaft 86 is adjustable relative to outer pivot tube 95. Adjustment is accomplished by loosening a set screw 111 which is threadably received in a hole in outer pivot tube 95. Shaft 86 is then moved to the desired elevation or proximity position and secured by tightening set screw 111.

Pivot shaft 86 is made tubular to form a conduit passageway 112 therethrough. The conduit passageway allows a coating conduit 113 and carrier gas conduit 114 to extend from the spray head nozzle block 120 down passageway 112 for connection to related equipment described below. Conduits 113 and 114 extend through a lower conduit feed opening 115. The angular position of the spray assembly is detected by an angular position sensor 119 (FIG. 11) which optically or otherwise senses the position of arm 104.

Spray-head 71 includes a first spray arm part 101 which is secured to the upper end of pivot shaft 86. A second spray arm part 102 is connected to first part 101 to form a tubular arm which extends outward from shaft 86. Shaft 86 and spray arm 71 pivots about pivot axis 105.

Spray-head 71 also includes a nozzle assembly mounting head 118 which is detachably connected to the distal end of second arm part 102 using fasteners (not shown). The nozzle head 118 mounts a nozzle block assembly 120. Nozzle block 120 has a nozzle extension 121 which fits within a mounting aperture 122 formed in mounting head 118. Nozzle extension 121 contains the nozzle 77 through which coating and any carrier gas are emitted. Nozzle block 120 is provided with fittings 123 and 124 which connect with the coating and carrier gas conduits 113 and 114.

Nozzle block 120 is preferably a nozzle which provides good atomization of the coating liquid using a carrier gas. The preferred nozzle block has internal features which cause ultrasonic vibrations to be generated as the carrier gas passes through the nozzle block. The ultrasonic vibrations assist in providing good atomization of the coating with particle sizes in the range of 0.1–10 microns, more preferably on the order of approximately 1 micron in diameter. A suitable nozzle type is Sonicair brand atomizing nozzle available from Ivek Corp. of North Springfield, Vt.

Nozzle block 120 is preferably provided with nozzle block heaters 127 which are preferably electrical resistance heaters. The nozzle block heaters are preferably attached to both opposing sides of the nozzle block to heat the nozzle block and achieve an approximate desired temperature range. This serves in providing consistent viscosity control since the nozzle will be heated to an elevated temperature which stays approximately the same during operation. Suitable temperatures are in the approximate range of 20–150° C., more preferably 30–100° C., even more preferably 40–80° C. Temperature can be controlled by varying the current passing through the nozzle block heaters.

Figure 9:
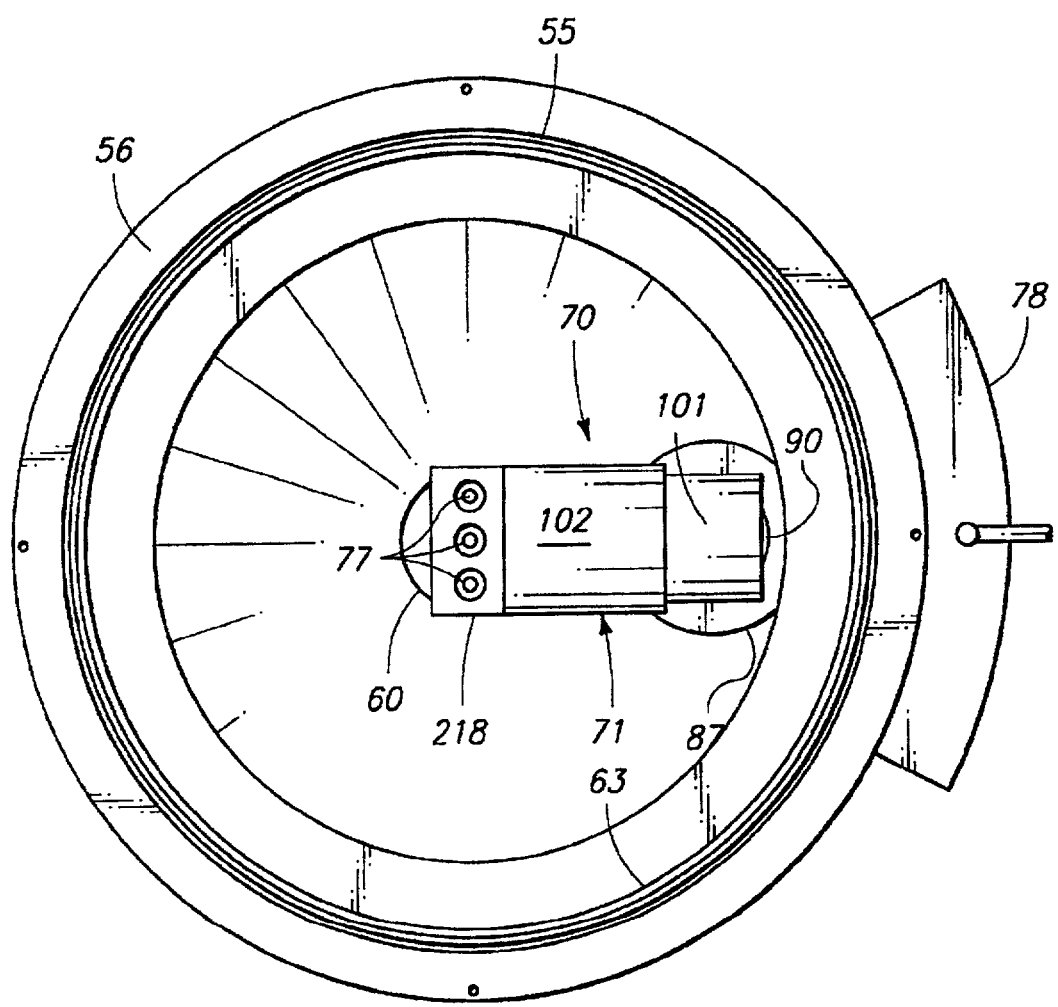
FIG. 9 is a top view of an alternative spray-head having multiple nozzles.

FIG. 9 shows an alternative form of spray assembly according to the invention. In this view the spray arm head piece 118 has been substituted by an alternative three nozzle head piece 218. Head piece 218 mounts three nozzle blocks similar to nozzle block 120. Each nozzle block has an emitting nozzle 77 and associated heaters. This arrangement provides a more diffuse spray pattern. Otherwise the construction is similar with minor modifications associated with the increased number of nozzles.

Spray Coating Station—Sprayer Fluid Supply

FIG. 10 shows a preferred system for supplying coating fluid and carrier gas to the nozzle block 120. Air, nitrogen or other suitable carrier gas is supplied from a facilities source via a cutoff valve 220. The gas then goes through a gas heater 221. A thermostatic control sensor 222 measures the temperature of the downstream gas passing through heater 221. Heater 221 is thus controlled to achieve a desired gas temperature. Alternatively sensor 222 can supply a signal to the central controller 300 (FIG. 11) and gas heater 221 can be used to controllably heat the carrier gas to a desired temperature. A pressure regulator 223 is downstream from heater 221 and is used to regulate the pressure of carrier gas being fed to nozzle block 120.

FIG. 10 also shows a coating fluid supply system. Coating is held in a coating reservoir 230. A control valve 231 can be included between the reservoir and pump 233. Pump 233 is preferably a precision controlled metering pump used with the preferred Sonicair brand nozzle described above and available from the same indicated source. The pump is controlled using a matching pump controller 235 which controls the pump and its related electrical operating motor to provide the desired flow rate. Coating is supplied to the nozzle block 120 via coating conduit 113. Typical operating pressures are in the range of 5–100 pounds per square inch gauge pressure (psi), more preferably 10–30 psi.

Spray Coating Station—Processing Head

Figure 4:
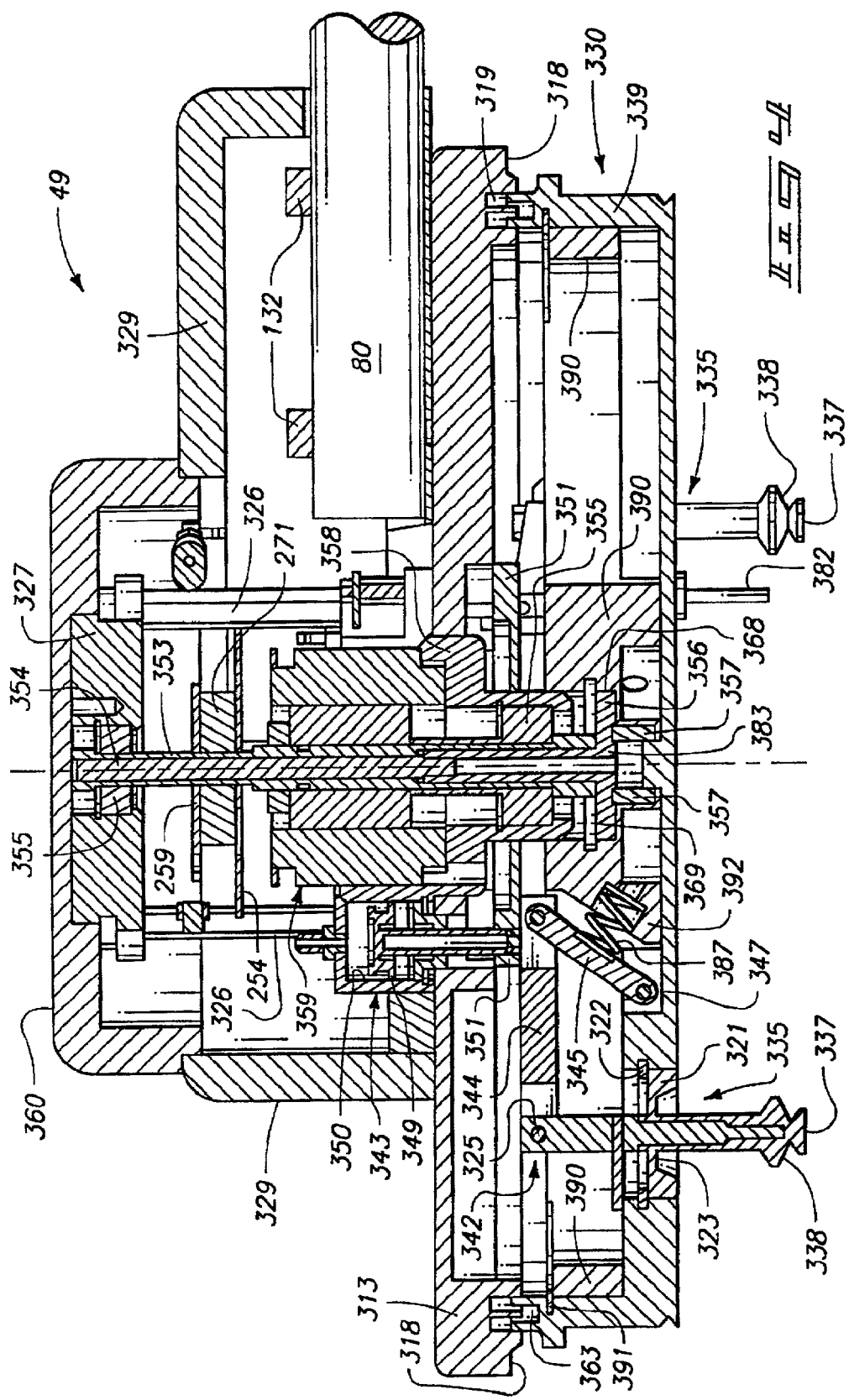
FIG. 4 is a side sectional view of the spray processing vessel head shown in phantom in FIG. 3. The section line is taken along a cutting plane which changes at the centerline of the rotating assembly to better show internal components.
Figure 5:
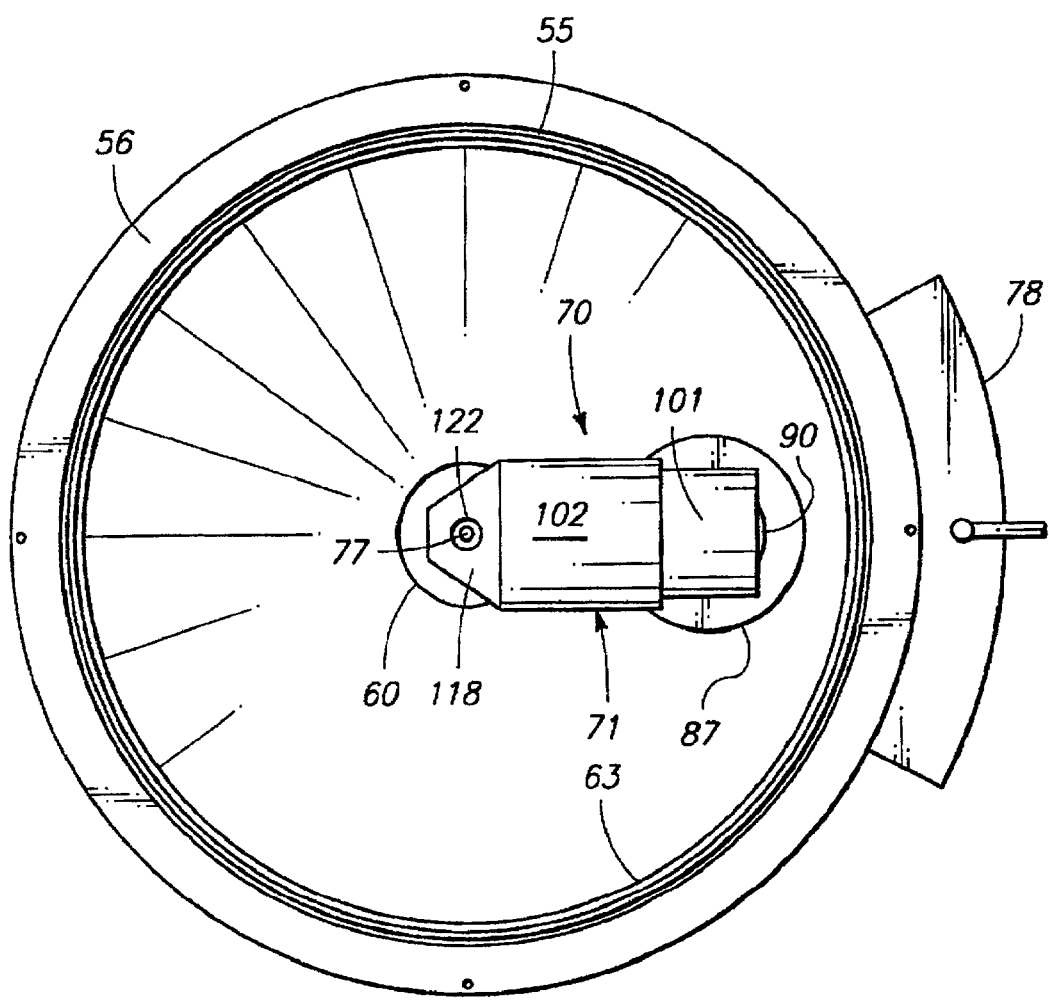
FIG. 5 is a top view of the spray processing vessel bowl shown in FIG. 3.

FIG. 4 shows The preferred construction for processing head 49. Head 49 is constructed similar to wafer processing head(s) shown and described in U.S. Pat. No. 5,235,995, issued Aug. 17, 1993 which is hereby incorporated by reference. Also pertinent are alternative processor head constructions shown and described in allowed U.S. patent application Ser. No. 07/855,767 filed Mar. 18, 1992, U.S. Pat. No. 5,431,421, issued Jul. 11, 1995 which is hereby incorporated by reference. For purposes of convenience and facilitating the understanding of this invention without specific reference to such earlier patent, additional description is set out herein.

It should also be noted as a preliminary matter that the cutting plane used in FIG. 4 changes orientation at the centerline of the rotor to better illustrate additional features of the invention.

Processing head 49 includes a shroud 313 which forms a main structural part of the head and is connected shaft 80. Shaft 80 is mounted to shroud 313 using mounting rings 132 and fasteners (not shown). Shaft 80 is pivotable by a head operator 131 (see FIG. 2). Head operator 131 lifts shaft 80 and attached head 49 up and down. Operator 131 also pivots shaft 80. Pivoting shaft 80 causes the attached head 49 to flip between face-up and face-down positions.

Shroud 313 is generally disk-shaped. The outer edge of shroud 313 forms a rim 318. The face of shroud 313 has annular recesses 319 which receive portions of a wafer support piece 330 in proximity thereto. Wafer support piece 330 is mounted for rotation relative to shroud 313. Shroud 313 is also provided with a central opening through which portions of a motor support 358 are received.

Head 49 also has a housing 329 attached to shroud 313 in which the motor and other parts are enclosed. A top cap 360 is connected to the housing to further enclose the internal mechanical workings of head 49. The shroud, housing and cap are advantageously made of polyvinylidene fluoride or other suitable materials.

The processor head includes spacers or columns 326 which extend from lower motor mount 358 upwardly to support the upper mount 327. Spacers 326 have interior bores which receive fasteners (not shown) which extend through apertures formed through mount 327.

Processor head 49 also includes a wafer holder or support 330. Wafer support 330 is movably mounted to remaining parts of the head assembly to provide rotation or other appropriate relative motion between the wafer being processed and the spray assembly 71. The wafer support includes a disk-shaped wafer support plate 339 having an exposed downwardly directed front face and a upwardly directed back face removed from the wafer 50 being processed. The wafer support plate 339 is advantageously constructed of polypropylene or other suitable material with an upturned flange 362 about the periphery thereof. Flange 362 can advantageously be provided with upwardly facing parallel extensions and associated grooves 363 to help restrict gas flow between flange 362 and shroud 319.

The wafer support 330 also includes a wafer support reinforcing wheel 390 which is secured within the wafer support piece 339 using a mounting ring 391. The reinforcing wheel 390 has a hub 392 to which is connected the output of motor 359. Such connection is described more fully below.

Wafer support 330 mounts a plurality of wafer support fingers 334, such as the four shown, or more. The wafer support fingers 334 have distal ends 337 which are formed to provide gripping notches 338 in which the peripheral edge of wafer 50 is held. The distal ends of support fingers 334 are spatially contracted toward one another to hold wafer 50, or expanded outwardly to release the wafer.

FIG. 4 shows that wafer support fingers 334 are flexibly mounted by finger bushings 335 to allow deflection thereof and the relative expansion and contraction needed for controlled gripping and release of wafer 50. Finger bushings 335 are preferably integrally formed with fingers 334. The finger bushings have an enlarged diameter exposed surface flange 321 which faces downwardly toward wafer 50. The finger bushings are held in position by a retaining ring 322 mounted to engage the back or upper surface of wafer support plate 339. The exposed, lower face also in part defines an annular web or diaphragm 323 which provides the flexibility needed to allow fingers 334 to pivotally deflect between expanded and contracted positions. The finger bushings 335 are made of a flexible material, such as TEFLON or other material suitable for service in the chemical environment which exists within processing chamber 63.

The wafer support fingers 334 also have upper or proximate ends 341 which are provided with connection receptacles 325. The connection receptacles receive end pieces 342 therein to form a mechanical coupling. End pieces 342 are displaced laterally by finger connection rods 344 to tilt the end pieces and attached wafer support fingers. The tilting action causes the relative expansion and contraction of the distal ends of the support fingers in the triad arrangement.

Actuation of the support fingers is advantageously accomplished using finger actuators 343. The finger actuators 343 each include a connecting rod 344 which is pivotally connected at a first or outer end to an end piece 342. The inner or second ends of connecting rods 344 are pivotally connected to a remote end of a positioning link 345. The opposite or mounted ends of positioning links 345 are pivotally connected to the wafer support plate 339 using positioning link brackets 347. The positioning links 345 are oriented at oblique angles extending inwardly from the pivotal connections with the brackets 347 toward the remote ends and the pivotal connections with connecting rods 344. The positioning links 345 can be provided with biasing springs 387 which urge links 345 upwardly and the associated wafer fingers 334 into contracted positions tending to grip the wafer.

The wafer support fingers are moved into expanded positions to release the wafer by displacing the pivotal joints between connecting rods 344 and positioning links 345 downwardly and inwardly. This causes the connecting rods to move inwardly in a radial direction to displace the proximate ends of the wafer fingers inwardly and the opposite distal ends outwardly to release the wafer. The connecting rods are displaced downwardly and inwardly by an annular contact ring 351. Contact ring 351 is operated by a pair of small pneumatic pistons 349. Pistons 349 are slidable within cylindrical piston cylinders 350 formed in motor support 358. Pressurized fluid is supplied to the upper sides of pistons 349 to force them downwardly and cause contact between annular contact ring 351 and connecting rods 344.

The wafer support piece 339 is also advantageously provided with a set of four standoffs 382 which serve to support wafer 50 during loading of the processing head. Wafer 50 is loaded with the head in a face-up position with the distal end of the standoffs available to be contacted by the backside of wafer 50.

The wafer support drive assembly includes a motor 359 which is mounted upon motor support 358. Motor 359 is preferably a brushless DC motor. Motor 359 has a hollow motor shaft 353 supported by a set of ball bearings 355. The hollow motor shaft 353 receives a detachable shaft 354 therethrough. Detachable shaft 354 is threadably connected to a shaft head 383. Shaft head 383 includes an enlarged flange 356. The shaft head is connected to the motor shaft to rotate therewith using a pin (not shown) or other suitable means. The flanged head is received within a shaft head receptacle 368 formed in the back surface of hub 392. Spaced, axially oriented, anti-rotation pins 357 are engaged between the lower face of the flanged shaft head 356 and corresponding holes formed in receptacle 368. A snap-ring retainer 369 holds the flanged head 356 axially within receptacle 368.

The angular positions of fingers 334 about the rotating assembly rotational axis X—X are preferably controlled to assume desired positions when the rotatable wafer support 330 stops. This indexing of the stationary positions of fingers 334 is needed when the processing head is opened to provide proper engagement of the wafer by the robotic transfer unit engagement head.

A preferred indexing means 250 used to position the wafer support, motor and other rotatable parts forming the rotating assembly of the processing head drive. Rotor positioning or indexing mechanism 250 includes a multi-sided cammed rotor plate 259 mounted to rotate with motor shaft 353 using coupling 271. The cam plate 259 has a plurality of sides equal in number to the number of fingers 334. Each side of rotor plate 259 has a curved edge configuration. The curved configurations of each of the three side segments are sloped relative to a circle defined by axis X—X. The curves slope from high points at the adjoining ends of the side segments toward central low points. The central low points serve as a detent when engaged by an edge engagement roller (not shown) which is controllably forced inward. When motor 359 is inoperative and the motor shaft is freely rotatable, the inward force of the roller causes rotor plate 259 to pivot to bring the rotating assembly into an angular position which centers the roller within a low point of the cammed rotor plate.

A motion monitoring assembly is also advantageously provided within processing head 49 for measuring the speed and direction of rotation of the wafer plate 330 about the rotational axis X—X. The motion monitoring assembly includes a rotor indicating element, such as rotor indicator disk 254. Indicator disk 254 is provided with a series of peripheral notches which intermittently pass and interrupt one or more optical beams and associated sensors (not shown).

Wafer Thermal Treatment Station

Figure 6:
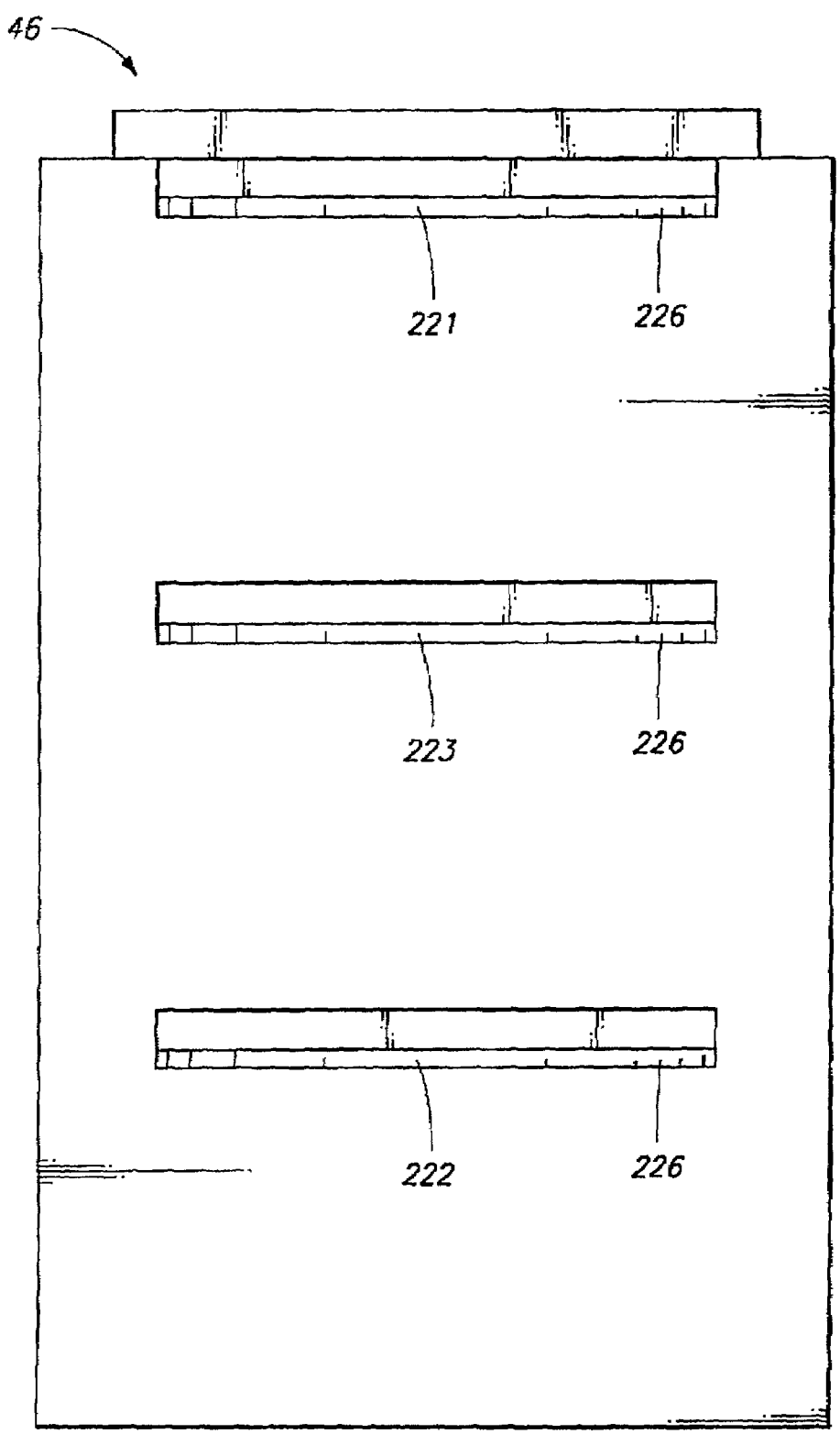
FIG. 6 is a front elevational view of a thermal treatment station used in the system of FIG. 1.
Figure 7:
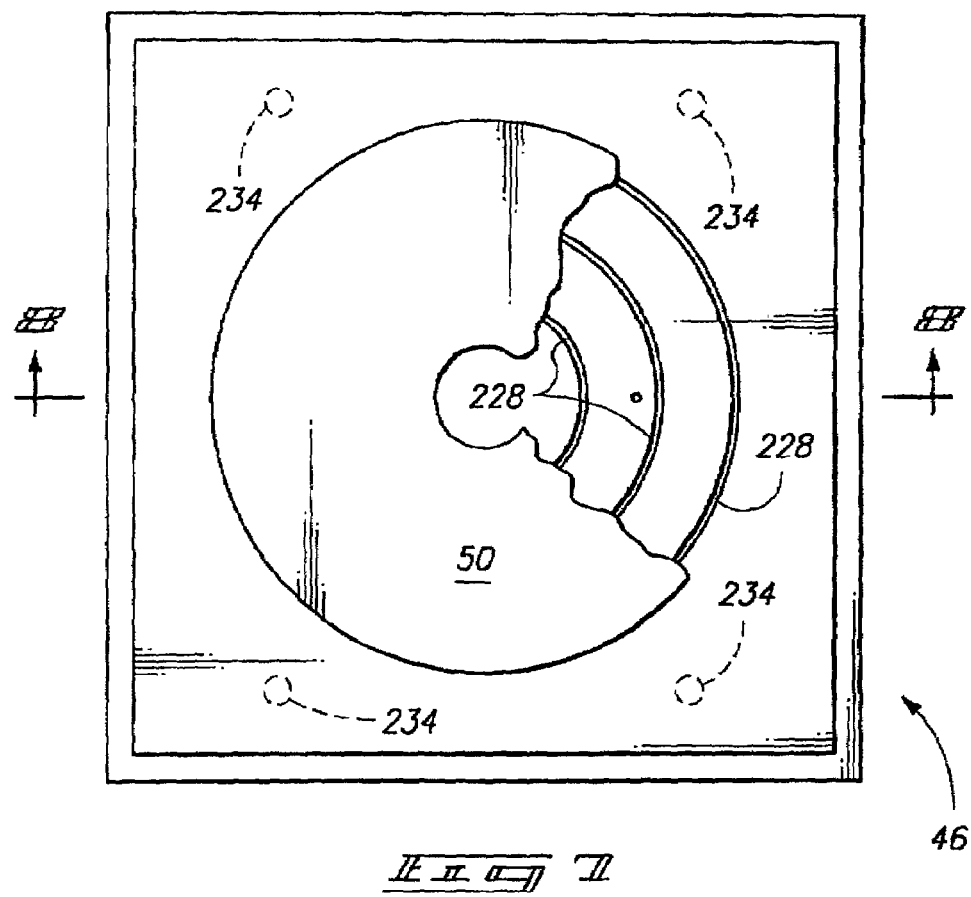
FIG. 7 is a top view of a one thermal treatment unit used in the thermal treatment station shown in FIG. 6.
Figure 8:
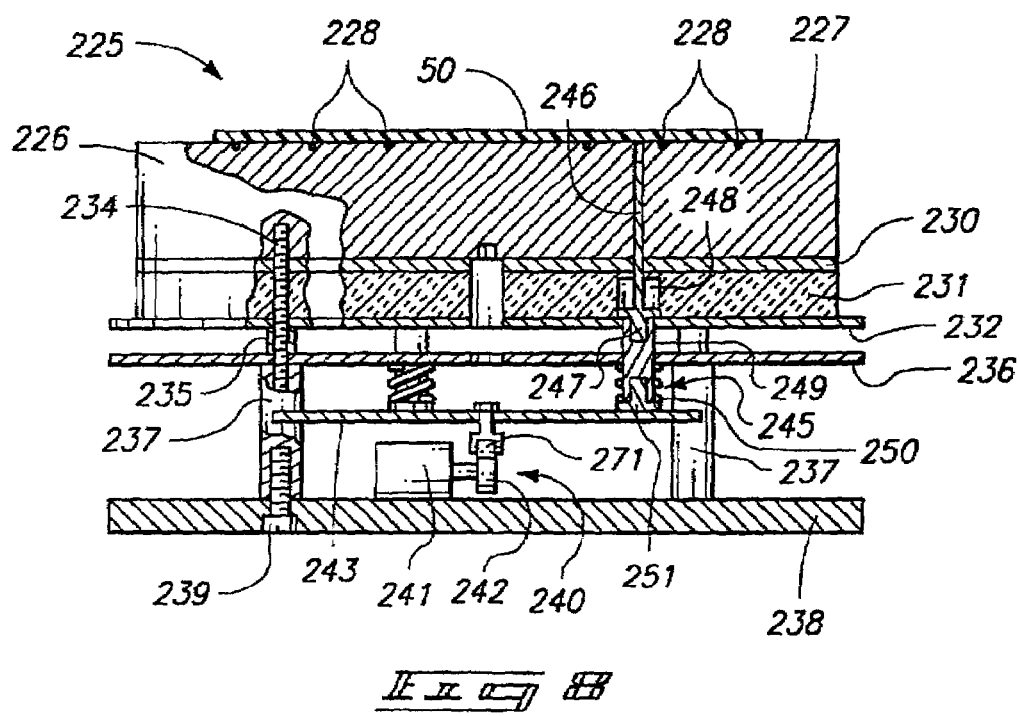
FIG. 8 is a sectional view along section line 8—8 of FIG. 7.

FIGS. 6–8 show a preferred form of thermal treatment station 46. Thermal treatment station 46 includes three bays or receiving chambers 221-3. Receiving bays 221-3 are designed to each receive a single wafer which has been coated in the spray coating station 40. The top and bottom receiving bays 221-2 are associated with thermal treatment units in the form of wafer heaters 225. The middle receiving bay 223 is provided with a thermal treatment unit in the form of a wafer cooler. The wafer heaters and cooler are constructed similarly. The preferred construction of both will now be described with specific reference to a wafer heater 225. The difference between the heaters and cooler will be noted in the description.

FIG. 8 shows a preferred wafer heater 225. A wafer 50 is positioned upon the upper surface of a platen 226. Platen 226 is preferably constructed with features that improve heat transfer between wafer 50 and the platen. More Specifically, the upper or contact surface 227 of the platen is formed to fit against the back surface of wafer 50. As shown, wafer 50 and the contact surface 227 have flat complementary contacting surfaces. The platen is preferably made from a metal of good thermal conductivity, such as aluminum. The contact surface of the platen is also preferably provided with a network or array of vacuum aperture grooves 228. As shown, vacuum apertures 228 are constructed as three concentric grooves which are controllably connected to a vacuum supply and supplied with vacuum pressure when the wafer is to be held in position upon platen 226. The vacuum pressure applied over the back side of wafer 50 pulls the wafer into better contact with the platen thus improving heat transfer. Vacuum is supplied to grooves 228 via vacuum conduits (not shown) formed in the platen.

The wafer heater is also preferably provided with a thermal source element 230 which is mounted to contact the back surface of platen 226. In the wafer heater 225 the thermal source element 230 is a serpentine electrical resistance heater. In the wafer cooler used for bay 223, the thermal source element is an array of cooling passages (not shown) through which are circulated a cooling fluid. Alternatively, a thermoelectric cooler or other suitable cooling apparatus formed in the shape of a relatively thin layer.

Thermal treatment unit 225 also has an insulatory back piece 231 which extends over the back of the platen and interposed heater or cooler 230. Insulation piece 231 is preferably formed of a suitable ceramic material having relatively good thermal insulating properties. A variety of suitable materials are available.

The platen 226, thermal source element 230, and insulating piece 231 are backed with a support plate 232. A fastener 234 is advantageously used to assembly these pieces. Fastener 234 is provided with male threads along it length and is received within mounting apertures formed in all four of the pieces. The mounting aperture in platen 226 is threaded. A spacer 235 is positioned adjacent the back support plate 232 and serves to space between plate 235 and a radiant shield plate 236 which reduces radiant heat transfer. The lower end of fastener 234 is received in a she-bolt 237 having internal female threads. The lower end of she-bolt 237 is fastened to the unit frame piece 238 using fastener 239. Thermal unit 235 preferably uses four assembly mountings as just described.

Thermal treatment unit 225 also has a lifting mechanism 240 for lifting wafer 50 from the surface of the platen. Lifting mechanism 240 includes a lifting actuator. The lifting actuator preferably includes a stepper motor 241 which has an output shaft which mounts a circular or other suitable cam 242. Cam 242 is eccentric upon the output shaft to controllably raise and lower a cam follower 271. Cam follower 271 is advantageously a rotatable bearing with associated outer race which contacts cam 271. Cam follower 271 is connected to an actuator plate 243 which moves up and down with controlled angular movement of the motor 241. Three lifting rod assemblies 245 are held in the platen assembly in a tripod arrangement. The lifting rod assemblies are contacted by the actuator plate and are moved upwardly and downwardly in response to operation of actuator 241.

Lifting rod assemblies 245 include a contact rod 246. Contact rod 246 is provided with an enlarged head 247 which is mounted for linear travel in a lifting rod receiving pocket 248. The contact rod also connects with a connector 249 which is slidably received through apertures formed through the back piece 232 and heat shield 236. A lift biasing spring 252 is compressed between the underside of shield 236 and a connector contact head 251. Spring 252 biases the contact rod upwardly to lift wafer 50. Actuator 240 overpowers the biasing springs to retract the contact rods downwardly. The rods can be fully or partially retracted to achieve contact or a desired proximity of the wafer to the platen 227.

Control System

FIG. 11 shows a schematic presentation of the preferred control system. In such there is a central controller 300 which is connected to various control system components which are either activated or provide sensory input information. Many alternative control system configurations are possible. As shown, the wafer transfer 41, touch screen display 31, disk drive 32, stop switch 33, keyboard port 34, spray arm motor 91, pump controller 235, thermal treatment station operator 221, processing head 49, head operator 131, thermal treatment station lift 240, and spray pivot sensor 119 are shown connected to the central controller.

Methods and Operation

The invention further includes novel methods for processing microelectronic or semiconductor articles to provide a coating thereon. The preferred methods are directed to processing methods which can provide a coating which conforms to surface irregularities which are necessarily a part of chemically etched or otherwise irregularly formed surface topologies.

In one form of the invention, the novel methods preferably include loading one or more wafers or other semiconductor articles into a processing enclosure. This is advantageously accomplished by opening the access door 24 and loading an input wafer cassette 57 into the input station position 43. The methods further advantageously include closing the access door and thereby substantially enclosing the processing compartment 15.

The preferred methods also advantageously can include transferring a wafer from the input station. This transferring is accomplished by inserting a wafer engagement tool, such as tool 67, into juxtaposition with wafer 50 and applying a vacuum force to effect holding of the wafer upon the engagement tool. The transferring also preferably includes moving the wafer from the input station by moving the wafer transfer apparatus 41.

The novel methods also preferably include positioning a wafer or other article within a spray processing vessel. This is done in the processing system 10 by loading the semiconductor article being coated into the spray coating station 40 and closing the processing vessel parts. Loading is preferably effected by lifting or raising the processing head 49. Loading further advantageously includes pivoting the wafer holding processing head into a face-up position to receive the wafer thereon. Loading also can include expanding the wafer engagement fingers into open positions to receive the wafer 50 therebetween, and then closing the fingers into engaging positions which hold the wafer. The loading phase further preferably includes pivoting processing head 49 into a face-down position adjacent to the processing vessel bowl 51. The processing vessel is then effectively closed by lowering or otherwise bringing the processing head into complementary relationship with the vessel bowl. Assembling the processing head and bowl together in conjoined relationship produces a substantially enclosed processing chamber 63 in which the wafer is coated.

In preferred forms of the invention the novel methods further may include rotating or otherwise moving the wafer. This is accomplished in processor 10 by rotating the processing head motor and attached wafer support piece 136. The rotating step is preferably accomplished at rotational speeds in the range of 1–1000 revolutions per minute, more preferably 10–300 revolutions per minute, even more preferably 50–200 revolutions per minute.

The methods further include spraying the wafer or other semiconductor or microelectronic article which has been positioned within the processing vessel. Spraying is accomplished while moving the spray head assembly 71. The moving of the spray head causes the nozzle or nozzles 77 to move relative to the article being coated. The spray head assembly is preferably pivoted to cause the relative movement between the nozzle 77 and the wafer surface. The rotational speed and relative movement of the nozzles are coordinated to achieve a uniform conformal layer of coating material.

In preferred methods according to this invention, the spray arm is advantageously started in a radial position outboard of the piece being coated. The spray can be started from the nozzle in an outboard position to reduce or eliminate any transitory startup effects before the coating spray contacts the wafer surface. Thereafter the spray arm is pivoted so that nozzle or nozzles 77 are swept to or through the rotational axis of the wafer. This movement of the spray nozzles is coordinated so that the coating application rate density is uniform over the area being coated. In the preferred methods the radial velocity of the nozzles relative to the wafer rotational centerline is increased as the nozzle position moves toward the center of rotation. Conversely, as the nozzle moves outwardly during any return spraying process, the radial velocity decreases. The nozzle path velocity is ideally a function which is inversely proportional to the radial position of the nozzle relative to the rotational centerline of the wafer. Even more preferably, the nozzle path velocity is a function which is inversely proportional to the square of the radial position of the nozzle.

The coordinated application step also considers the application rate which is precisely controlled to effect metering of the spray coating liquid. This metering is performed in system 10 by the coordinated operation of spray pump 233, pump controller 235, and associated carrier gas flow rate. In the coating of semiconductor wafers, liquid coating pump rates in the approximate range of 1–1000 microliters per second are potentially useful, more preferably 5–300 microliters per second, even more preferably 10–100 microliters per second. The coating flow rate to the nozzles is most preferably kept at a constant or nearly constant rate during the spraying operation. This has been found advantageous in providing stable operation.

The methods according to this invention also preferably use carrier gas flows which provide significant coating particle velocities. Increased coating particle velocities aid in impacting the particles against the surface of the wafer or other article being coated to provide better conformal coating application.

It may be preferable in some coating applications to utilize carrier gases which participate in or are specifically inert to the chemistry involved. For example, in the application of polyimide coatings it has been found desirable to utilize nitrogen instead of air. The processing chamber is preferably purged with nitrogen and the carrier gas used is also nitrogen. This reduces chemical effects upon the polyimide which are associated with moisture which is present in air supplies even when treated to reduce or remove moisture. In other situations the carrier gases used may enhance or retard coating setup rates and may be desirable with the particular coating being applied.

In some forms of the invention, novel methods include heating the carrier gas which is used in the spraying. This heating is effected in the preferred embodiment using heater 221. The spraying also preferably includes regulating the carrier gas pressure. Pressures in the range of approximately 0–25 pounds per square inch gauge are believed appropriate, more preferably carrier gas pressures are regulated to be in the approximate range of 5–15 pounds per square inch gauge. The volume of carrier gas can vary from none to relatively high flow rates depending upon the coating being applied. The figures given above are for nozzles having an approximate orifice diameter in the range 1/8–1/16 inch.

The spraying also preferably includes generating a sonic vibratory resonance within the spray block to cause atomizing to be performed to achieve the approximate coating particle sizes indicated above. The generating of vibratory resonance is preferably effected by passing the carrier gas through a suitable nozzle structure, such as the ultrasonic nozzle explained above.

Spraying according to the novel methods of this invention also advantageously includes controlling the viscosity of the coating liquid being applied. This controlling is advantageously effected by heating the coating to achieve greater stability with regard to viscosity fluctuations. The heating is best done by heating the nozzle block 120 using the heaters 127. The controlled heating of the carrier gas is also a relevant parameter in achieving control of the coating viscosity.

The preferred methods may also advantageously include providing a purge of gas along the back side of wafer 50. This purging of the atmosphere along the wafer back side helps to prevent coating overspray from settling and adhering to the back side of the wafer. Such a purging function is accomplished with a gas purge port (not shown) which supplies purge gas to the back side of support piece 339 and an aperture which is formed through support piece 339 at a desired location.

The methods of this invention further include removing or unloading the coated wafer or other semiconductor article from the processing chamber. This is advantageously accomplished by opening the processing vessel. Opening the processing vessel includes lifting or otherwise removing the processing head 49 from the processing bowl 51. It further preferably includes pivoting the processing head to turn the wafer into a coated-side-up or face-up position.

Unloading also preferably includes engaging the wafer with the wafer engagement tool in the same or very similar manner described above with regard to transferring the wafer from the input station.

The coated wafer is then preferably transferred to a thermal treatment station, such as thermal treatment station 46. This is done using the wafer transfer 41. The process of transferring the wafer also includes loading or installing the wafer into a thermal treatment receiver, such as either of the heating treatment chambers 221 or 222. During loading of the thermal treatment chambers, the wafer contact members 246 are extended. Thus the extending step should be performed before installing the wafer into the thermal treatment chamber. The wafer transfer functions by gently lowering the wafer onto the contact members. Thereafter the engagement tool functions by retracting from the thermal treatment chamber. The thermal treatment unit then functions by lowering the lifting mechanism 240. The lowering or moving into proximity can result in a desired proximity spacing, such as 0.5–1 millimeter. In other coating applications it may be preferred to perform the positioning by contacting the wafer against the platen 226 by fully retracting the contact members 246. The wafer is then subjected to vacuum by applying vacuum pressures via channels 228 which causes a forcing of the wafer against the platen.

The methods further preferably include transferring heat relative to the wafer. In the most preferred methods the heat transferring includes both heating and cooling. The heating step is preferably accomplished first. The heating is effected by activating the heater 225 to heat the platen and allow heat to flow from the platen to the wafer. The heating is preferably performed for sufficient time to render the coating mechanically stable upon the surface of the wafer. The time needed to accomplish this will vary depending on the coating and wafer being coated. In many situations, the heat treatment time will be in the range of 1–10 minutes, more preferably 1–3 minutes. Thereafter the vacuum pressure is reduced thereby releasing the force applied by the vacuum. The wafer is then readied for removal by lifting or otherwise extending the wafer using the wafer lifting mechanism.

After the heating step, the wafer is then most preferably transferred from a heating chamber 221 or 222, to the cooling chamber 223. The loading process is the same or similar to that described above in connection with the heating chamber. The cooling treatment process is also very similar to that described above for the heating process. The cooling treatment in general requires about one-half the time required for the heat treatment curing of the coating. Thus the need for only one cooling unit for two heating units.

After the coated wafer has been coated, and then heated, cooled or both, it is again transferred by wafer transfer 41. The wafer transfer moves the wafer to the output station 44. At the output station, the wafer transfer performs by inserting the wafer into the output station carrier 58 in an available space therein. When all wafers of a batch have been completed, the output wafers are removed by opening the access door and manually removing the carrier.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A wafer processor for processing a wafer such as a semiconductor wafer, a magnetic disk, or an optical disk, comprising:
    a processing bowl having an upper edge; and
    a processor head comprising a motor and a wafer holder, the motor being carried above the wafer holder and operatively coupled to the wafer holder, the wafer holder being adapted to overlay a single wafer and support the single wafer about a periphery of the wafer with a process side of the wafer facing downward for rotation at a height below the upper edge of the processing bowl with the processor head extending outwardly of the periphery of the wafer.

2. The wafer processor of claim 1 wherein the processor head is adapted to be lifted with respect to the processing bowl.

3. The wafer processor of claim 1 wherein the wafer holder extends downwardly from an upper portion of the processor head to position a wafer below the upper portion of the processor head.

4. The wafer processor of claim 3 wherein the upper portion of the processor head extends outwardly of the periphery of the wafer.

5. The wafer processor of claim 3 wherein the upper portion of the processor head extends outwardly over the upper edge of the processing bowl.

6. The wafer processor of claim 3 wherein the motor is carried by the upper portion of the processor head.

7. The wafer processor of claim 3 wherein the motor is enclosed within the upper portion of the processor head.

8. The wafer processor of claim 1 wherein the processor head comprises an annular gas-receiving recess having a height above a height of a front surface of any wafer carried by the wafer support.

9. The wafer processor of claim 1 wherein the wafer support comprises a wafer support plate.

10. The wafer processor of claim 9 wherein the processor head has an upper portion which extends outwardly beyond the wafer support plate.

11. The wafer processor of claim 1 wherein the wafer support comprises an acid-resistant material.

12. The wafer processor of claim 11 wherein the acid-resistant material comprises polyvinylidene fluoride.

13. The wafer processor of claim 1 wherein the wafer support comprises a wafer support plate having a downwardly directed front face and an upwardly directed back face.

14. The wafer processor of claim 13 wherein the wafer support plate carries a plurality of fingers adapted to engage a peripheral edge of a wafer.

15. The wafer processor of claim 14 wherein the fingers peripherally support the wafer.

16. A wafer processor for processing a wafer such as a semiconductor wafer, a magnetic disk, or an optical disk, comprising:
a processing bowl having an upper edge; and
a processor head comprising an upper portion housing a motor, a rotatable wafer support carried below the upper portion, a vertical shaft coupling the motor to the wafer support, and a mount carried by the upper portion, the wafer support being adapted to overlay and peripherally support a single wafer at a height below the upper edge of the processing bowl, the mount being adapted to facilitate lifting of the processor head with respect to the processing bowl.

17. The wafer processor of claim 16 wherein the wafer holder extends downwardly from the upper portion of the processor head to position a wafer below the upper portion of the processor head.

18. The wafer processor of claim 16 wherein the upper portion of the processor head extends outwardly of the periphery of the wafer.

19. The wafer processor of claim 16 wherein the upper portion of the processor head extends outwardly over the upper edge of the processing bowl.

20. The wafer processor of claim 16 wherein the motor is enclosed within the upper portion of the processor head.

21. The wafer processor of claim 16 wherein the processor head comprises an annular gas-receiving recess having a height above a height of a front surface of any wafer carried by the wafer support.

22. The wafer processor of claim 16 wherein the wafer support comprises a wafer support plate.

23. The wafer processor of claim 16 wherein the wafer support comprises an acid-resistant material.

24. The wafer processor of claim 23 wherein the acid-resistant material comprises polyvinylidene fluoride.

25. The wafer processor of claim 16 wherein the wafer support comprises a wafer support plate having a downwardly directed front face and an upwardly directed back face.

26. The wafer processor of claim 25 wherein the wafer support carries a plurality of fingers adapted to engage a peripheral edge of a wafer.

27. The wafer processor of claim 26 wherein the fingers peripherally support the wafer.

28. A wafer processor for processing a wafer such as a semiconductor wafer, a magnetic disk, or an optical disk, comprising:
a processing bowl having an upper edge; and
a processor head comprising an upper portion, a motor enclosed within the upper portion, and a wafer holder extending downwardly from the upper portion, the motor being coupled to the wafer holder by a downwardly extending shaft, the wafer holder being adapted to overlay and peripherally support a single wafer at a height below the upper edge of the processing bowl with the upper portion of the processor head extending outwardly of the periphery of the wafer.

29. The wafer processor of claim 28 wherein the processor head includes a mount adapted to facilitate lifting of the processor head.

30. The wafer processor of claim 28 wherein the upper portion of the processor head extends outwardly over the upper edge of the processing bowl.

31. The wafer processor of claim 28 wherein the processor head comprises an annular gas-receiving recess having a height above a height of a front surface of any wafer carried by the wafer support.

32. The wafer processor of claim 28 wherein the wafer support comprises a wafer support plate.

33. The wafer processor of claim 32 wherein the processor head has an upper portion which extends outwardly beyond the wafer support plate.

34. The wafer processor of claim 28 wherein the wafer support comprises an acid-resistant material.

35. The wafer processor of claim 34 wherein the acid-resistant material comprises polyvinylidene fluoride.

36. The wafer processor of claim 28 wherein the wafer support comprises a wafer support plate having a downwardly directed front face and an upwardly directed back face.

37. The wafer processor of claim 36 wherein the wafer support plate carries a plurality of fingers adapted to engage a peripheral edge of a wafer.

38. The wafer processor of claim 37 wherein the fingers peripherally support the wafer.

39. A wafer processor for processing a wafer such as a semiconductor wafer, a magnetic disk, or an optical disk, comprising:
a processing bowl having an upper edge; and
a processor head comprising:
a motor carried in an upper housing;
a downwardly extending shaft coupled to the motor
a wafer holder coupled to and extending downwardly from the shaft, the wafer holder being adapted to overlay and peripherally support a single wafer for rotation by the motor at a height below the upper edge of the processing bowl.

40. The wafer processor of claim 39 wherein the processor head includes a mount adapted to facilitate lifting of the processor head.

41. The wafer processor of claim 39 wherein the upper portion of the processor head extends radially outwardly over and around the upper edge of the processing bowl.

42. The wafer processor of claim 39 wherein the processor head comprises an annular gas-receiving recess having a height above a height of a front surface of any wafer carried by the wafer support.

43. The wafer processor of claim 39 wherein the wafer support comprises a wafer support plate.

44. The wafer processor of claim 43 wherein the processor head has an upper portion which extends outwardly beyond the wafer support plate.

45. The wafer processor of claim 39 wherein the wafer support comprises an acid-resistant material.

46. The wafer processor of claim 45 wherein the acid-resistant material comprises polyvinylidene fluoride.

47. The wafer processor of claim 39 wherein the wafer support comprises a wafer support plate having a downwardly directed front face and an upwardly directed back face.

48. The wafer processor of claim 47 wherein the wafer support plate carries a plurality of fingers adapted to engage a peripheral edge of a wafer.

49. The wafer processor of claim 48 wherein the fingers peripherally support the wafer.

50. An apparatus for handling a wafer, comprising:
a processing head including a wafer support;
a wafer processor comprising a processing bowl and a processor head;
means for releasably engaging a periphery of a wafer with the wafer support;
means for positioning the wafer at a height below an upper edge of the processing bowl with the wafer support extending downwardly from a location positioned above the upper edge of the processing bowl, the processing head overlying the wafer and supporting the periphery of the wafer to hold the wafer face down;
means for rotating the wafer at the height below the upper edge of the processing bowl; and
means for lifting the processing head.

51. The wafer processor of claim 39, further comprising:
a spray processing vessel defined by the processing bowl;
a spray-head mounted within the spray processing vessel for directing a spray of coating upon a single wafer being held face down by the wafer holder, the spray-head being moveable relative to the spray processing vessel and relative to the wafer holder to allow the spray-head to be directed to different areas of the wafer;
a gas conduit for delivering a carrier gas to the spray-head;
a coating conduit for delivering a coating material to the spray-head;
a coating metering pump for delivering a precise quantity of the coating material to the spray head; and
a coating viscosity control for controlling viscosity of the coating material applied by the spray-head.

52. The wafer processor of claim 39 wherein the processor head further comprises a wafer plate that overlays the wafer and a circular shroud over the motor.

53. The wafer processor of claim 39, further comprising:
gripping fingers arranged to engage the periphery of the wafer; and actuator means to pivotally move the gripping fingers to engage/disengage the periphery of the wafer.

54. The wafer processor of claim 53 further comprising flexible support diaphragms sealingly engaged with corresponding gripping fingers.

* * * * *

UNITED STATES PATENT AND TRADEMARK OFFICE
CERTIFICATE OF CORRECTION

PATENT NO.         : 7,094,291 B2
APPLICATION NO.   : 09/893316
DATED              : August 22, 2006
INVENTOR(S)        : Reardon et al.

It is certified that error appears in the above-identified patent and that said Letters Patent is hereby corrected as shown below:

On the Title Page item (56), Include the cited references as listed below:

| | | | | | |
|---|---|---|---|---|---|
| US-2,774,364 | 12-18-1956 | Brobeil | US-4,668,334 | 05-26-1987 | Doornveld |
| US-3,107,034 | 10-15-1963 | Dunnous | US-4,687,542 | 08-18-1987 | Davis et al. |
| US-4,688,918 | 08-25-1987 | Suzuki et al. | US-4,693,777 | 09-15-1987 | Hazano et al. |
| US-4,709,858 | 12-01-1987 | Stern et al. | US-4,724,317 | 02-09-1988 | Brown et al. |
| US-4,736,758 | 04-12-1988 | Kusuhara | US-4,745,422 | 05-17-1988 | Matsuoka et al. |
| US-4,749,440 | 06-07-1988 | Blackwood et al. | US-4,778,559 | 10-18-1988 | McNeilly |
| US-4,788,994 | 12-06-1988 | Shinbara | US-4,793,282 | 12-27-1988 | Greenberg et al. |
| US-4,797,316 | 01-10-1989 | Hecq et al. | US-4,804,560 | 02-14-1989 | Shioya et al. |
| US-4,830,882 | 05-16-1989 | Ichinose et al. | US-4,832,580 | 05-23-1989 | Tsuyoshi et al. |
| US-4,857,142 | 08-15-1989 | Syverson | US-4,863,066 | 09-05-1989 | Uffenheimer et al. |
| US-4,865,641 | 09-12-1989 | Sasse et al. | US-4,871,417 | 10-03-1989 | Nishizawa et al. |
| US-4,875,824 | 10-24-1989 | Moe et al. | US-4,885,047 | 12-05-1989 | Ury et al. |
| US-4,895,099 | 01-23-1990 | D'Amato | US-4,900,395 | 02-13-1990 | Syverson et al. |
| US-4,923,054 | 05-08-1990 | Ohtani et al. | US-4,924,800 | 05-15-1990 | Tanaka |
| US-4,932,353 | 06-12-1990 | Kawata et al. | US-4,936,940 | 06-26-1990 | Kawasumi et al. |
| US-4,938,691 | 07-03-1990 | Ohkase et al. | US-4,944,837 | 07-31-1990 | Nishikawa |
| US-4,960,406 | 10-02-1990 | Gorodissky et al. | US-4,977,688 | 12-18-1990 | Roberson, Jr. et al. |
| US-4,987,854 | 01-29-1991 | Hall | US-4,996,080 | 02-26-1991 | Daraktchiev |
| US-5,002,008 | 03-26-1991 | Ushijima et al. | US-5,056,462 | 10-15-1991 | Perkins et al. |
| US-5,065,692 | 11-19-1991 | Hollesen et al. | US-5,085,560 | 02-04-1992 | Thompson et al. |
| US-5,094,884 | 03-10-1992 | Hillman et al. | US-5,127,362 | 07-07-1992 | Iwatsu et al. |
| US-5,168,886 | 12-08-1992 | Thompson et al. | US-5,168,887 | 12-08-1992 | Thompson et al. |
| US-5,183,508 | 02-02-1993 | Cholinski | US-5,224,503 | 07-06-1993 | Thompson et al. |
| US-5,232,328 | 08-03-1993 | Owczarz et al. | US-5,235,995 | 08-17-1993 | Bergman et al. |
| US-5,252,137 | 10-12-1993 | Tateyama et al. | US-5,270,248 | 12-14-1993 | Rosenblum et al. |
| US-5,358,740 | 10-25-1994 | Bornside et al. | US-5,378,511 | 01-03-1995 | Cardinali et al. |
| US-5,395,803 | 03-07-1995 | Adams | US-5,403,617 | 04-04-1995 | Haaland |
| US-5,429,912 | 07-04-1995 | Neoh | US-5,431,421 | 07-11-1995 | Thompson et al. |
| US-3,148,085 | 09-08-1964 | Wiegmann | US-3,313,266 | 04-11-1967 | Kelson |
| US-3,326,717 | 06-20-1967 | Gregor et al. | US-3,339,297 | 09-05-1967 | Stinn et al. |
| US-3,489,608 | 01-13-1970 | Jacobs et al. | US-3,585,668 | 06-22-1971 | Jaccodine et al. |
| US-3,601,627 | 08-24-1971 | Booher | US-3,727,620 | 04-17-1973 | Orr |
| US-3,773,578 | 11-20-1973 | Glendinning et al. | US-4,056,462 | 11-01-1977 | Li et al. |
| US-4,065,692 | 12-27-1977 | Osterhout | US-4,085,560 | 04-25-1978 | McClosky |
| US-4,094,884 | 06-13-1978 | Kelly | US-4,127,362 | 11-28-1978 | Fladby |

UNITED STATES PATENT AND TRADEMARK OFFICE
CERTIFICATE OF CORRECTION

PATENT NO.         : 7,094,291 B2
APPLICATION NO. : 09/893316
DATED                  : August 22, 2006
INVENTOR(S)       : Reardon et al.

It is certified that error appears in the above-identified patent and that said Letters Patent is hereby corrected as shown below:

| | | | | |
|---|---|---|---|---|
| US-4,139,333 | 02-13-1979 | Sipos | US-4,159,917 | 07-03-1979 Gluck |
| US-4,161,356 | 07-17-1979 | Giffin et al. | US-4,168,886 | 09-25-1979 Grifaliunas |
| US-4,168,887 | 09-25-1979 | Yevick | US-4,183,508 | 01-15-1980 Michelet et al. |
| US-4,192,087 | 03-11-1980 | Salomon | US-4,222,345 | 09-16-1980 Bergfelt et al. |
| US-4,224,503 | 09-23-1980 | Gijzel et al. | US-4,232,328 | 11-04-1980 Hartman et al. |
| US-4,246,088 | 01-20-1981 | Murphy et al. | US-4,252,137 | 02-24-1981 Cohen |
| US-4,264,374 | 04-28-1981 | Beyer et al. | US-4,267,212 | 05-12-1981 Sakawaki |
| US-4,270,248 | 06-02-1981 | Akashi | US-4,282,825 | 08-11-1981 Nagatomo et al. |
| US-4,290,384 | 09-22-1981 | Ausschnitt et al. | US-4,313,266 | 02-02-1982 Tam |
| US-4,339,297 | 07-13-1982 | Aigo | US-4,344,743 | 08-17-1982 Bessman et al. |
| US-4,378,511 | 03-29-1983 | Simovits, Jr. | US-4,403,617 | 09-13-1983 Tretinyak |
| US-4,416,213 | 11-22-1983 | Sakiya | US-4,429,912 | 02-07-1984 Smith, Jr. |
| US-4,429,983 | 02-07-1984 | Cortellino et al. | US-4,437,812 | 03-20-1984 Abu-Shumays et al. |
| US-4,457,259 | 07-03-1984 | Samuels | US-4,457,419 | 07-03-1984 Ogami et al. |
| US-4,475,665 | 10-09-1984 | Norton | US-4,483,665 | 11-20-1984 Hauser |
| US-4,519,846 | 05-28-1985 | Aigo | US-4,542,038 | 09-17-1985 Odaka et al. |
| US-4,580,699 | 04-08-1986 | Black et al. | US-4,588,185 | 05-13-1986 Shoda et al. |
| US-4,590,094 | 05-20-1986 | Ringer, Jr. | US-4,601,627 | 07-22-1986 Oka et al. |
| US-4,605,479 | 08-12-1986 | Faith, Jr. | US-4,651,440 | 03-24-1987 Karl |
| JP-45-40458 | 12/1970 | | JP-1-204427 | 08-17-1989 Hitachi Ltd. |
| JP-1-304732 | 11-17-1998 | Kubota Corp. | JP-231330 | 11-16-1985 Seiichirou Sougou |
| JP-54-161275 | 12-20-1979 | Toshiba Corp. | JP-56-88320 | 07-17-1981 Fujitsu Ltd. |
| JP-58-19475 | 02-04-1983 | Asahi Chem Ind Co. Ltd | JP-59-166675 | 09-20-1984 Fujitsu KK |
| JP-61-148820 | 07-07-1986 | Hitachi Ltd. | | |
| JP-54-71991 | 06-08-1979 | Matsushita Electronics Corp. | | |
| JP-3010-974 | 08-15-1979 | Matsushita Elec Ind. Co. Ltd. | | |

A Mechanism of Particle Generation and a Method to Suppress Particles in Vapor HF/H20 System", in Shigeo Onishi, et al., Extended abstracts of the 22nd (1990 International) Conference on Solid State Devices and Materials, Sendai, 1990, pp. 1127-1139.

BEYER et al., "IBM Tech. Disc. Bull," Etching of SiOz in Gaseous HF/H20, Vol 19, No. 7, December 1976, p 2513.

UNITED STATES PATENT AND TRADEMARK OFFICE
CERTIFICATE OF CORRECTION

PATENT NO. : 7,094,291 B2
APPLICATION NO. : 09/893316
DATED : August 22, 2006
INVENTOR(S) : Reardon et al.

It is certified that error appears in the above-identified patent and that said Letters Patent is hereby corrected as shown below:

BRISKA, M. et al. "Process for Reducing Gold or Copper Wafer Contamination During Oxide Removal," IBM Technical Disclosure Bullentin, Vol 19, No. 7, p. 2574, December 1976.

BURGGRAAF, Pieter, "Vapor-Phase Cleaning at Reduced Pressure," Semiconductor International, p 36 (Dec. 1989).

IBM Technical Disclosure Bulletin, Vol. 32, No. 1, June 1989, "Upside-Down Resist Coating of Semiconductor Wafers".

MOREAU et al., "Wafer Cleaner System," IBM Technical Disclosure Bulletin, Vol 19, No. 10, pp 2905-2906 (March 1972).

Product Brochure, "Preliminary Product Information-EDGE 2000", Advantage, Production Technology Incorp (1989).

VAN DER HEIDE, P.A.M., et al., "Etching of Thin SiO2 Layers Using Wet HR Gas," J. Vac. Sci. Technol. A7(3), pp. 1719-1723, (May/June 1989).

Signed and Sealed this

Twenty-third Day of June, 2009

JOHN DOLL
*Acting Director of the United States Patent and Trademark Office*